United States Patent
Fukuzumi

(10) Patent No.: US 8,957,471 B2
(45) Date of Patent: Feb. 17, 2015

(54) SEMICONDUCTOR MEMORY DEVICE AND METHOD FOR MANUFACTURING SAME

(75) Inventor: Yoshiaki Fukuzumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 408 days.

(21) Appl. No.: 13/051,595

(22) Filed: Mar. 18, 2011

(65) Prior Publication Data

US 2012/0132983 A1 May 31, 2012

(30) Foreign Application Priority Data

Nov. 30, 2010 (JP) .................................. 2010-267570

(51) Int. Cl.
  *H01L 29/792* (2006.01)
  *H01L 21/336* (2006.01)
  *H01L 27/115* (2006.01)

(52) U.S. Cl.
  CPC ...... *H01L 29/7926* (2013.01); *H01L 27/11565* (2013.01); *H01L 27/11573* (2013.01); *H01L 27/11582* (2013.01)
  USPC .... 257/324; 257/315; 257/220; 257/E21.423; 257/E29.309; 257/242; 438/268

(58) Field of Classification Search
  CPC ............ H01L 27/115; H01L 27/11565; H01L 27/11582; H01L 27/11573
  USPC ................................. 257/315–322, 324, 336
  See application file for complete search history.

(56) References Cited

U.S. PATENT DOCUMENTS

| 7,847,342 | B2 * | 12/2010 | Fukuzumi et al. | 257/324 |
| 7,910,432 | B2 * | 3/2011 | Tanaka et al. | 438/257 |
| 2009/0310415 | A1 * | 12/2009 | Jin et al. | 365/185.17 |
| 2011/0108907 | A1 * | 5/2011 | Maeda | 257/324 |

* cited by examiner

*Primary Examiner* — Matthew W Such
*Assistant Examiner* — David Spalla
(74) *Attorney, Agent, or Firm* — Oblon, Spivak, McClelland, Maier & Neustadt, L.L.P.

(57) ABSTRACT

According to one embodiment, a semiconductor memory device includes a substrate, a stacked body, a conductive member, a semiconductor pillar, and a charge storage layer. The stacked body is provided above the substrate. The stacked body includes a plurality of insulating films stacked alternately with a plurality of electrode films. A plurality of terraces are formed in a stairstep configuration along only a first direction in an end portion of the stacked body on the first-direction side. The first direction is parallel to an upper face of the substrate. The plurality of terraces are configured with upper faces of the electrode films respectively. The conductive member is electrically connected to the terrace to connect electrically the electrode film to the substrate by leading out the electrode film in a second direction parallel to the upper face of the substrate and orthogonal to the first direction. The semiconductor pillar is provided in a central portion of the stacked body and extends in a stacking direction of the insulating films and the electrode films. The charge storage layer is provided between the electrode film and the semiconductor pillar.

11 Claims, 18 Drawing Sheets

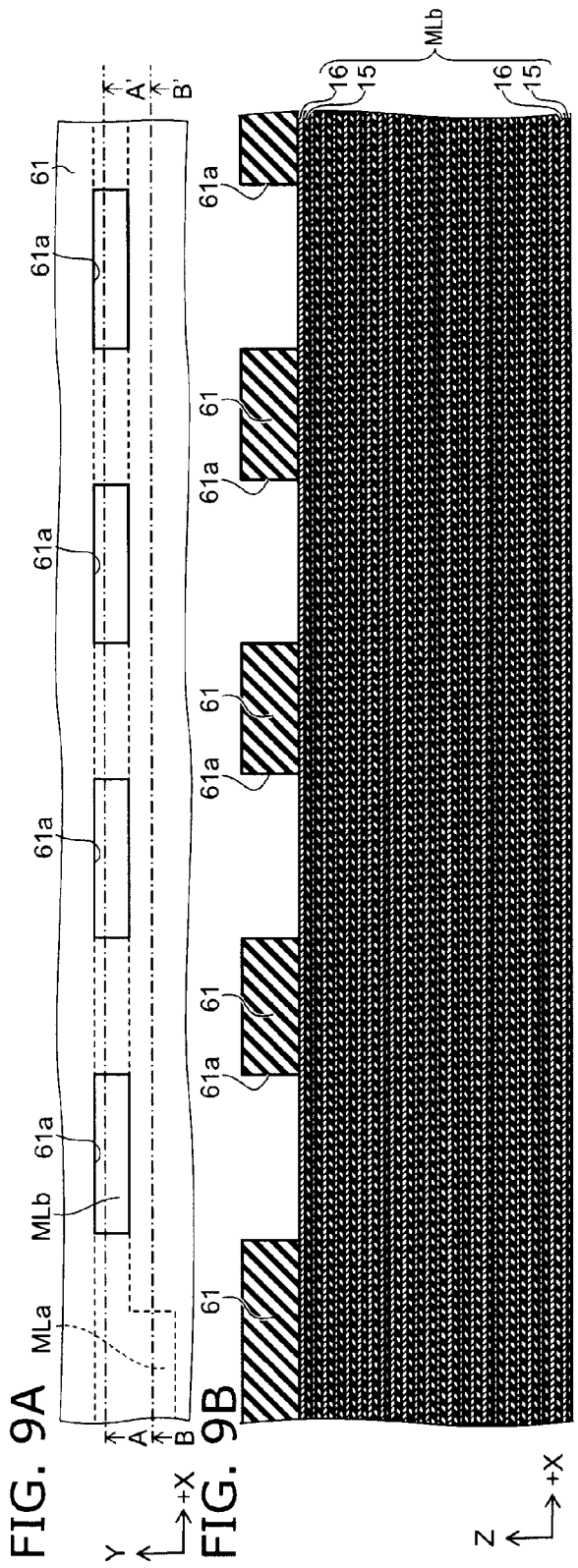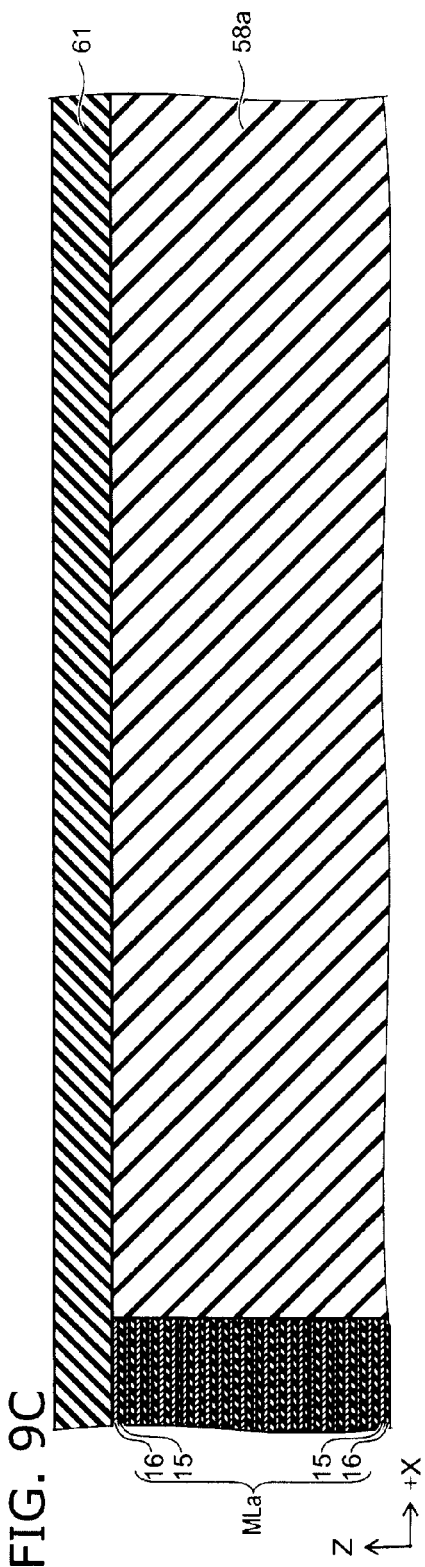

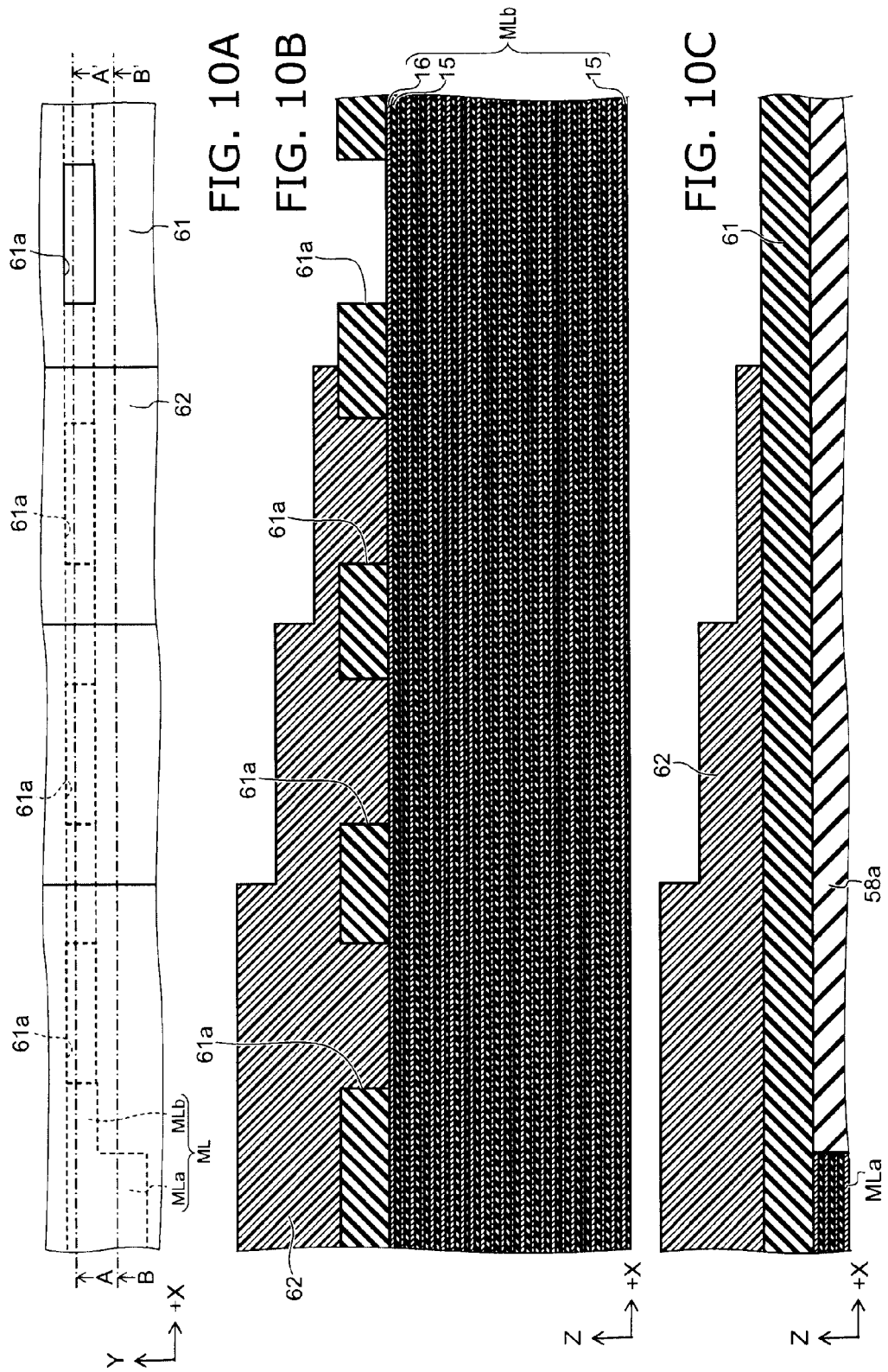

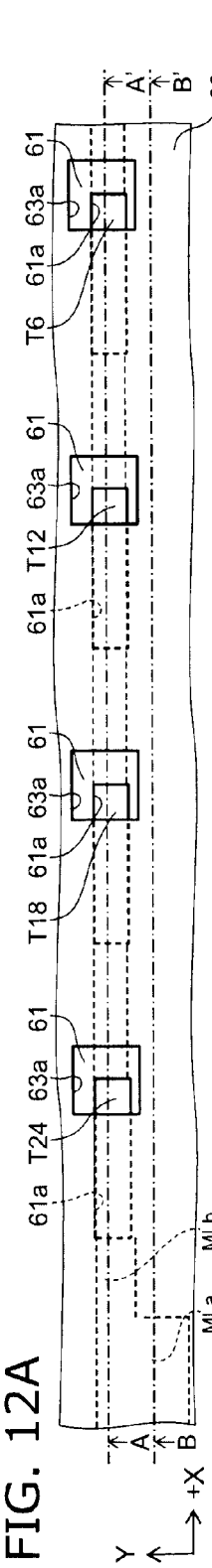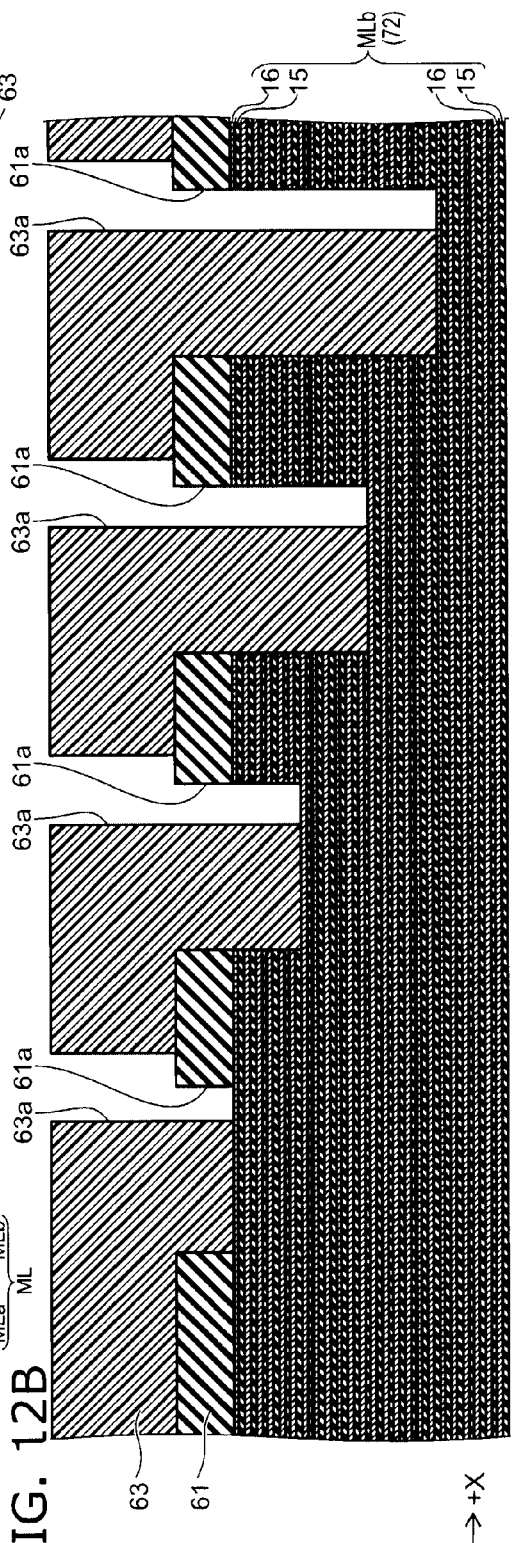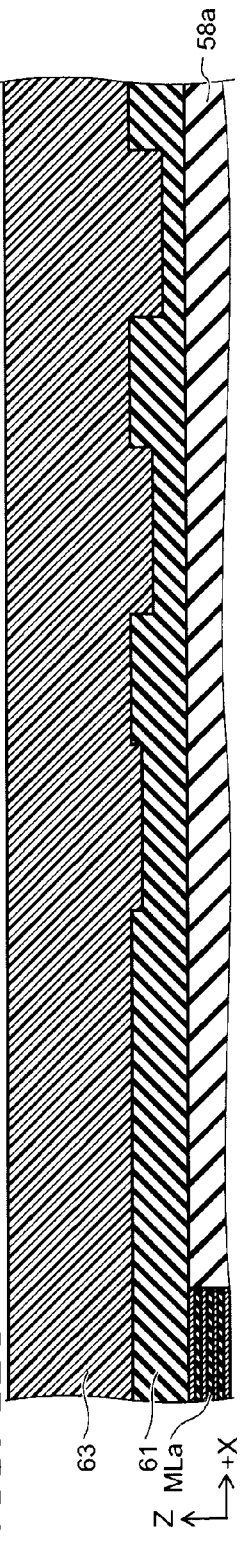

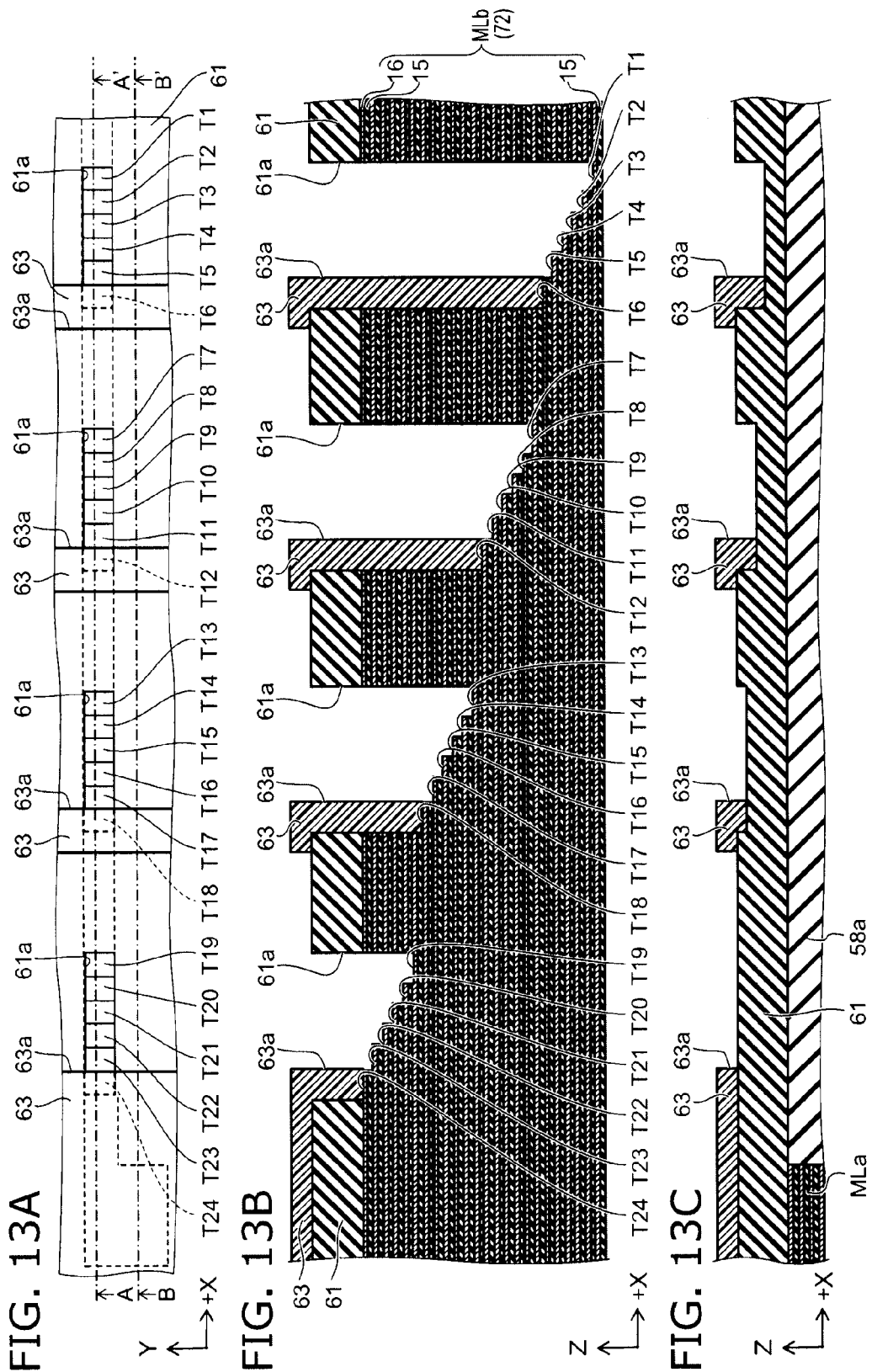

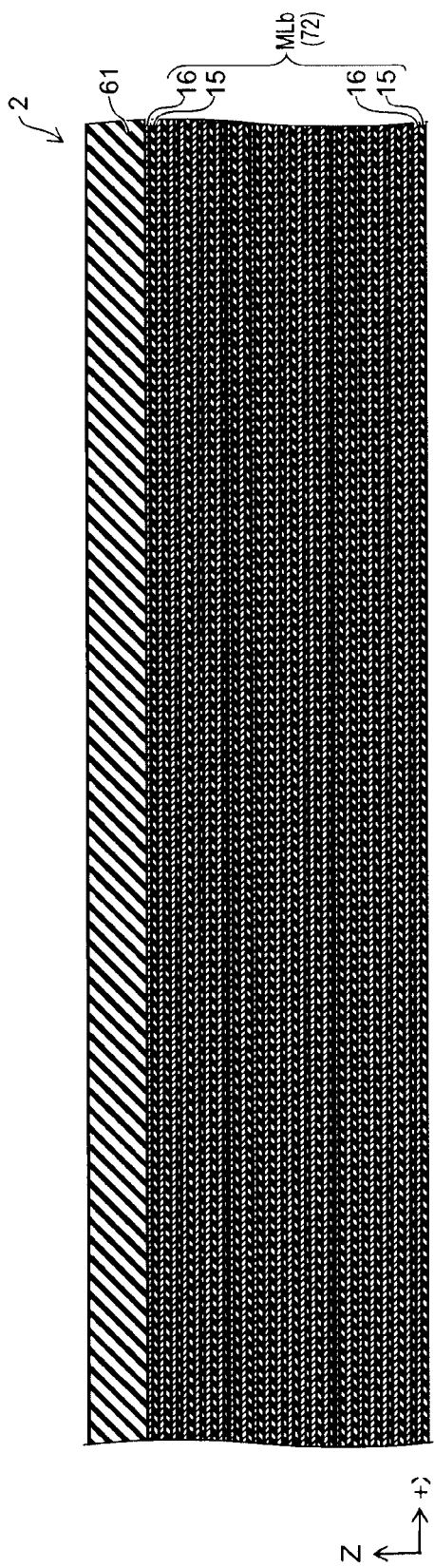
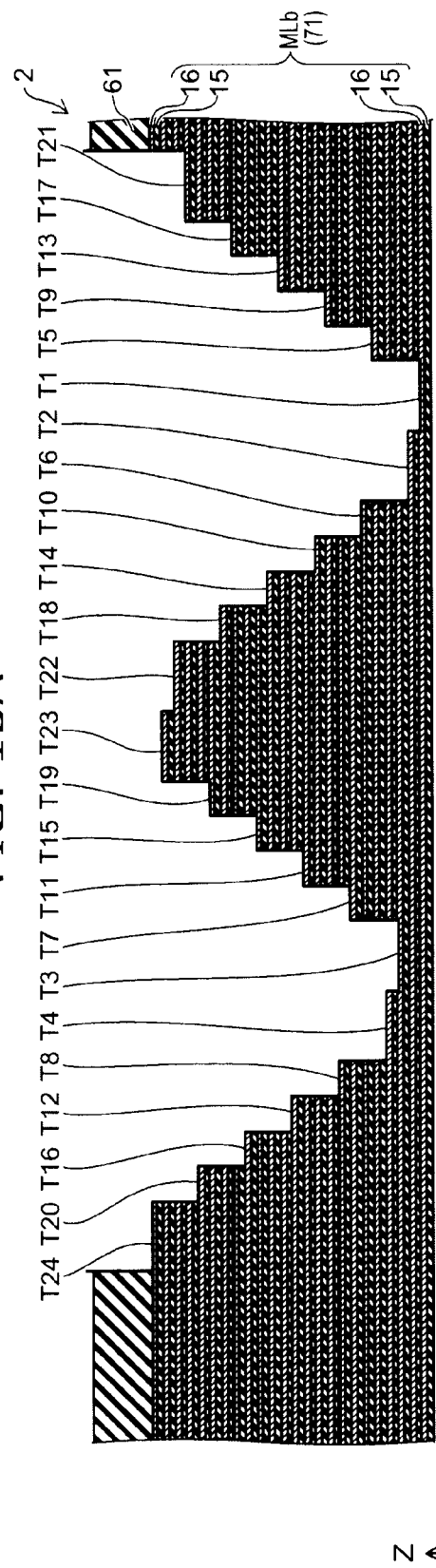
FIG. 15A
FIG. 15B

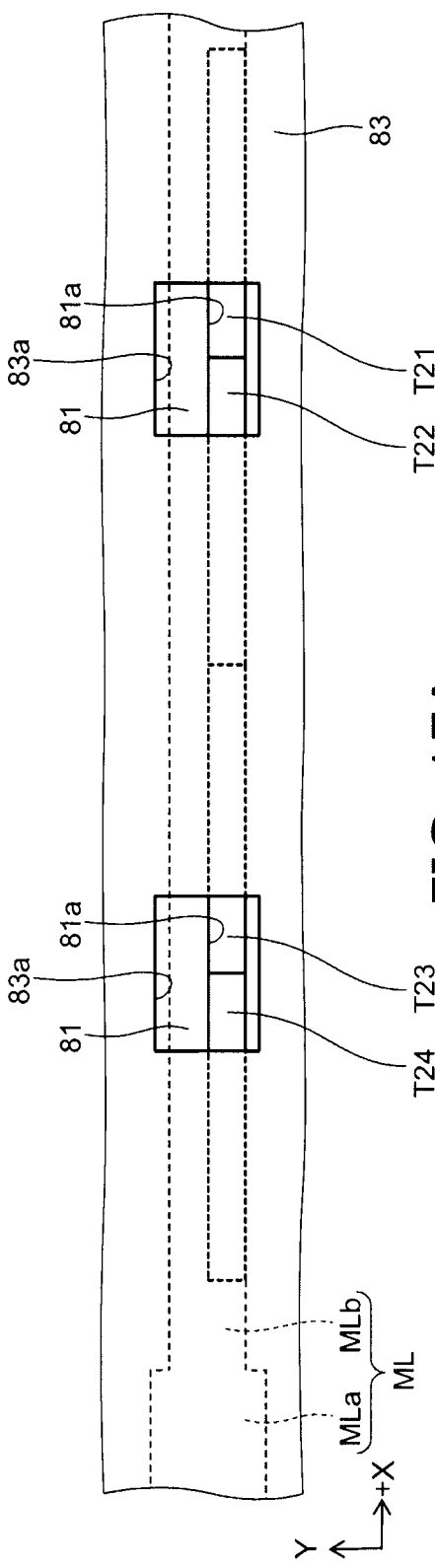
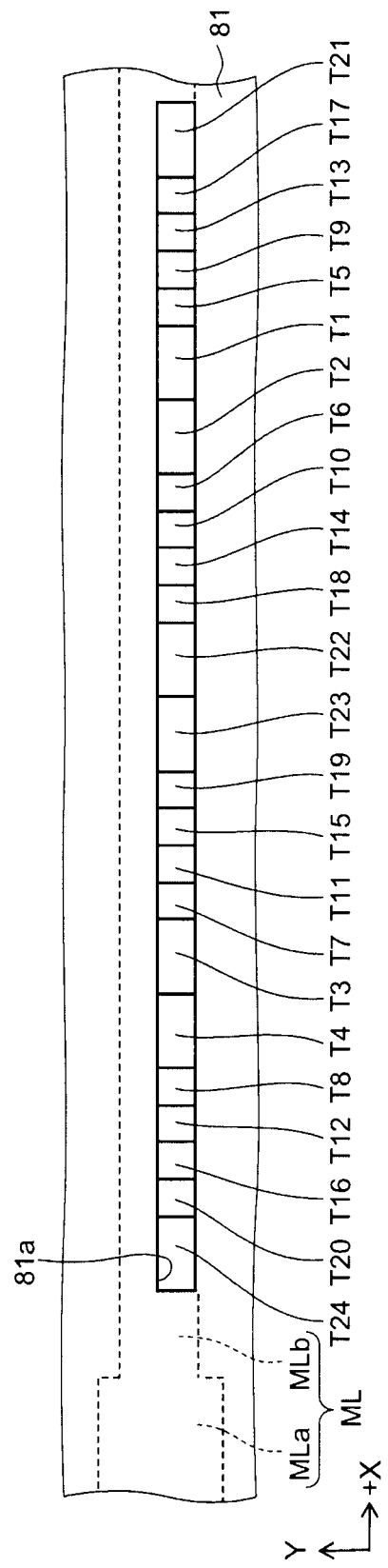

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2010-267570, filed on Nov. 30, 2010; the entire contents of which are incorporated herein by reference.

FIELD

Embodiments described herein relate generally to a semiconductor memory device and a method for manufacturing the same.

BACKGROUND

Collectively patterned stacked memory has been proposed as a method to increase the capacity and reduce the cost of semiconductor memory devices. Collectively patterned stacked memory is manufactured by forming a stacked body on a semiconductor substrate by alternately stacking insulating films and electrode films, subsequently making a through-hole in the stacked body using lithography, depositing a blocking layer, a charge storage layer, and a tunneling layer in this order inside the through-hole, and filling a silicon pillar into the through-hole. In such a stacked memory, memory cells are formed by forming memory transistors at the intersections between the electrode films and the silicon pillar. A peripheral circuit region is provided in addition to the memory region where the stacked body is formed; and a drive circuit that drives the memory cells is formed in the peripheral circuit region. The end portion of the stacked body has a stairstep configuration in which a terrace is formed for each electrode film; and a contact is electrically connected to each of the electrode films.

BRIEF DESCRIPTION OF THE DRAWINGS

FIG. 9A to FIG. 9C are views of processes, illustrating a method for manufacturing the semiconductor memory device according to the first embodiment;

FIG. 10A to FIG. 10C are views of processes, illustrating the method for manufacturing the semiconductor memory device according to the first embodiment;

FIG. 12A to FIG. 12C are views of processes, illustrating the method for manufacturing the semiconductor memory device according to the first embodiment;

FIG. 13A to FIG. 13C are views of processes, illustrating the method for manufacturing the semiconductor memory device according to the first embodiment;

FIGS. 15A and 15B are cross-sectional views illustrating the end portion of the stacked body of the second embodiment, where FIG. 15A is a cross-sectional view along line D-D' of FIG. 14 and FIG. 15B is a cross-sectional view along line E-E' of FIG. 14;

FIGS. 17A and 17B are process plan views illustrating the method for manufacturing the semiconductor memory device according to the second embodiment.

DETAILED DESCRIPTION

In general, according to one embodiment, a semiconductor memory device includes a substrate, a stacked body, a conductive member, a semiconductor pillar, and a charge storage layer. The stacked body is provided above the substrate. The stacked body includes a plurality of insulating films stacked alternately with a plurality of electrode films. A plurality of terraces are formed in a stairstep configuration along only a first direction in an end portion of the stacked body on the first-direction side. The first direction is parallel to an upper face of the substrate. The plurality of terraces are configured with upper faces of the electrode films respectively. The conductive member is electrically connected to the terrace to connect electrically the electrode film to the substrate by leading out the electrode film in a second direction parallel to the upper face of the substrate and orthogonal to the first direction. The semiconductor pillar is provided in a central portion of the stacked body and extends in a stacking direction of the insulating films and the electrode films. The charge storage layer is provided between the electrode film and the semiconductor pillar.

According to another embodiment, a method is disclosed for manufacturing a semiconductor memory device. The method can include forming a stacked body on a substrate by stacking a plurality of insulating films alternately with a plurality of electrode films. The method can include forming a plurality of terraces in an end portion of the stacked body on a first-direction side by selectively removing the electrode films. The first direction is parallel to an upper face of the substrate. The plurality of terraces is arranged along only the first direction. The plurality of terraces are configured with upper faces of the electrode films respectively. The method can include making a through-hole in a central portion of the stacked body. The through-hole extends in a stacking direction of the insulating films and the electrode films. The method can include forming a charge storage layer on an inner face of the through-hole. The method can include forming a semiconductor pillar inside the through-hole. In addition, the method can include forming a conductive member electrically connected to the electrode film at the terrace to connect electrically the electrode film to the substrate by leading out the electrode film in a second direction parallel to the upper face of the substrate and orthogonal to the first direction.

Embodiments of the invention will now be described with reference to the drawings.

First, a first embodiment will be described.

Figure 1:
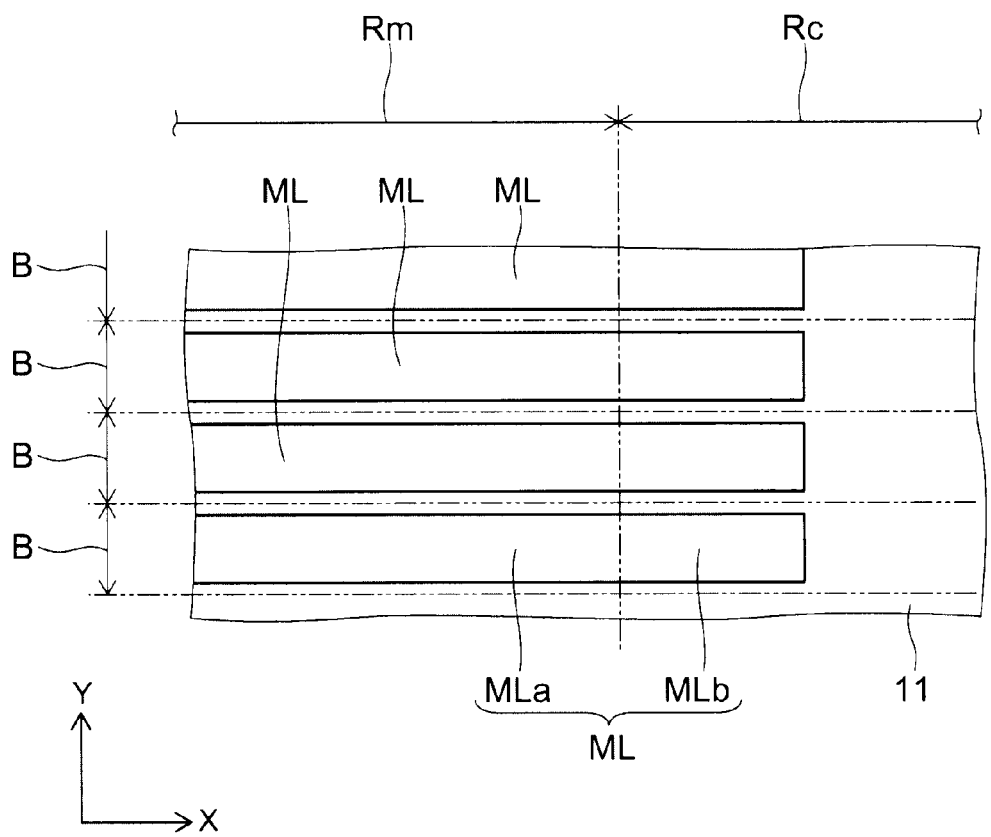
FIG. 1 is a plan view illustrating a semiconductor memory device according to a first embodiment.

FIG. 1 is a plan view illustrating a semiconductor memory device according to this embodiment.

Figure 2:
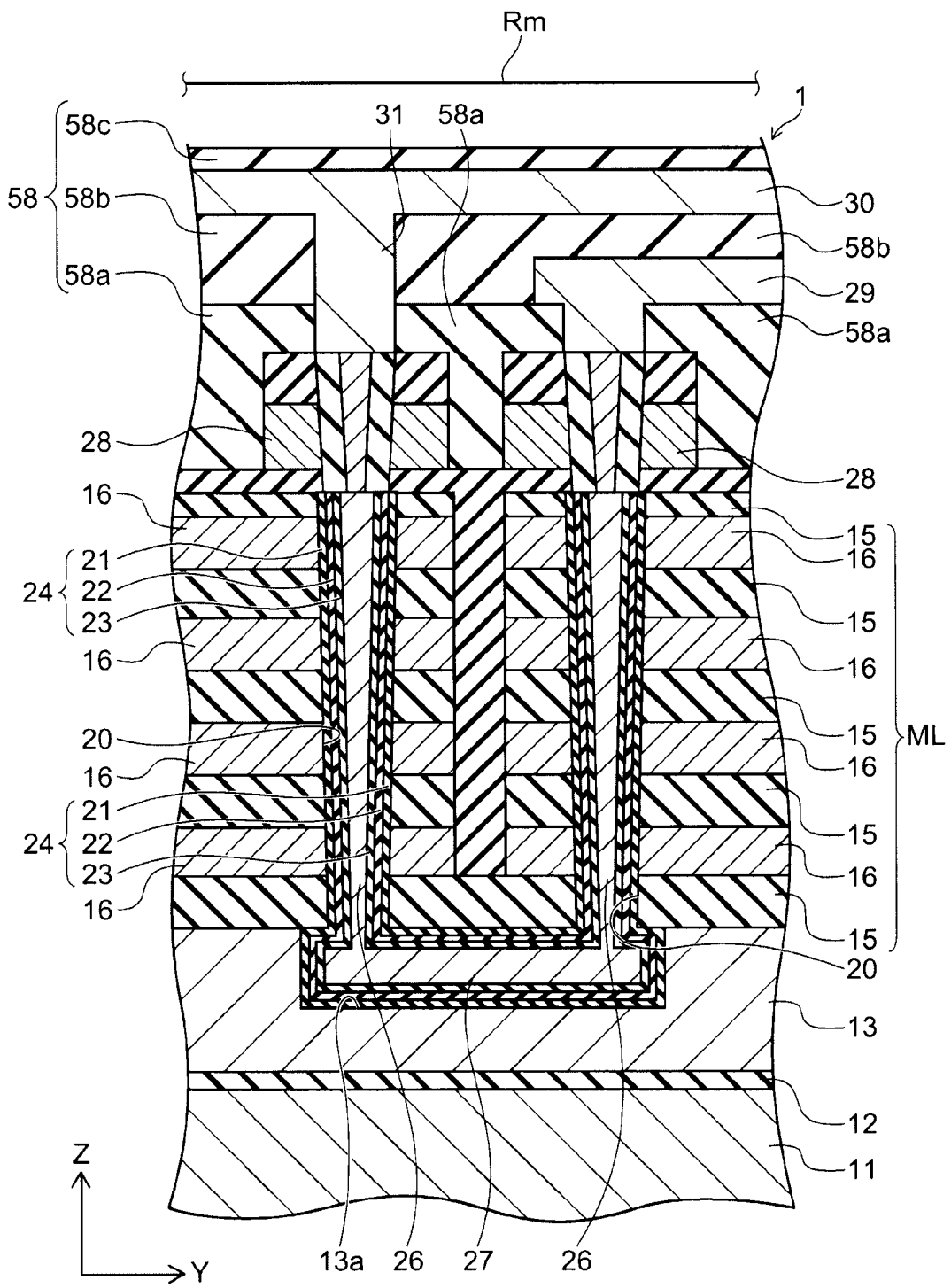
FIG. 2 is a cross-sectional view illustrating a central portion of a stacked body of the first embodiment.

FIG. 2 is a cross-sectional view illustrating a central portion of a stacked body of this embodiment.

Figure 3:
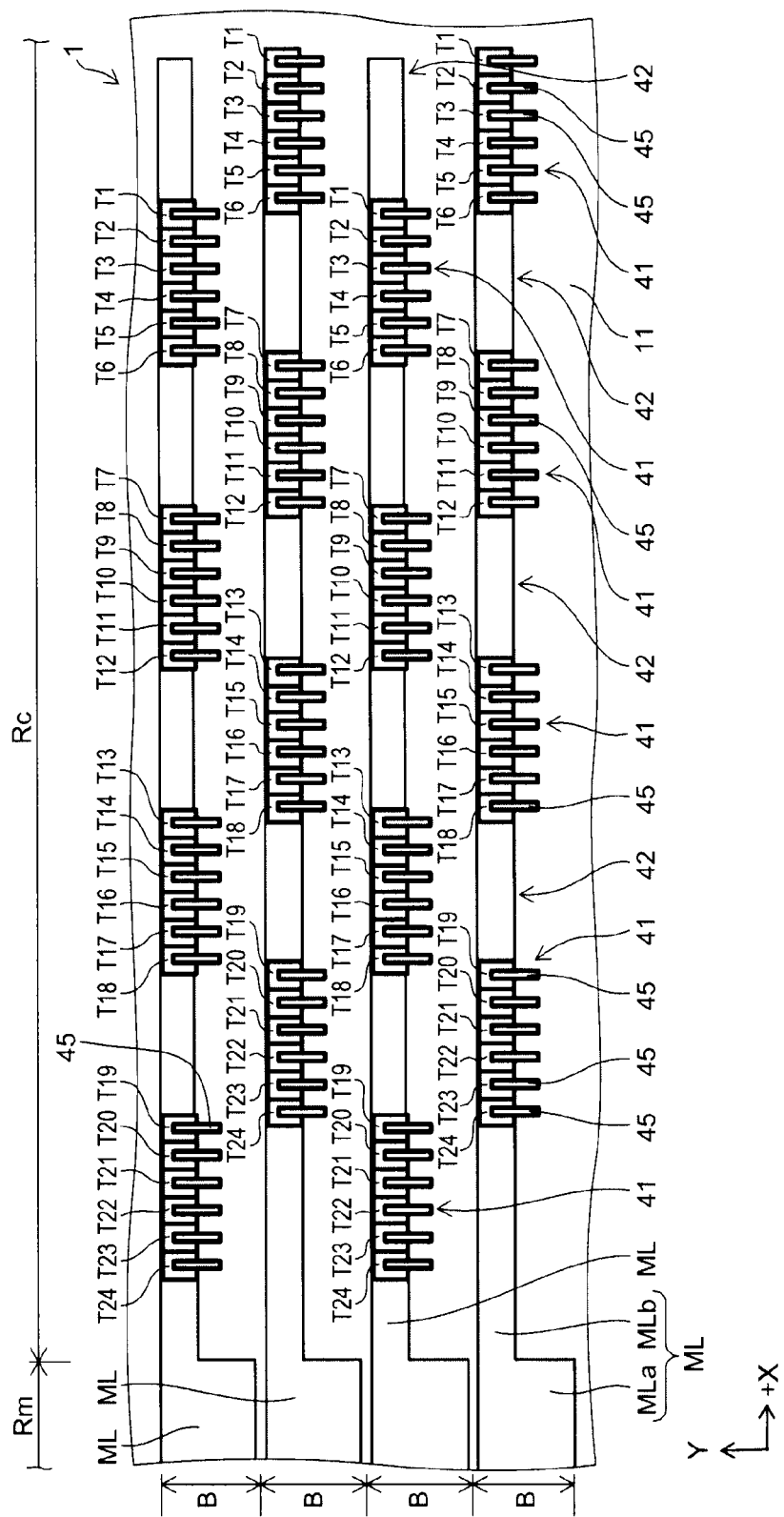
FIG. 3 is a plan view schematically illustrating an end portion of the stacked body of the first embodiment.

FIG. 3 is a plan view schematically illustrating an end portion of the stacked body of this embodiment.

Figure 4A:
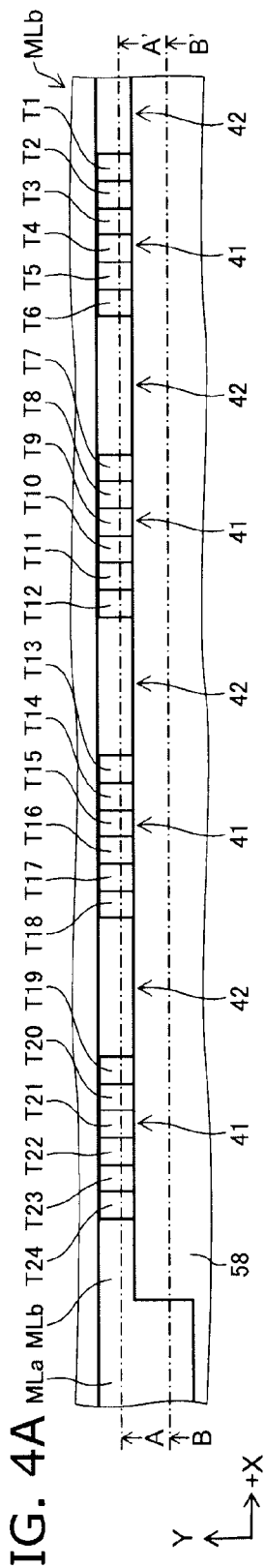
FIG. 4A is a plan view illustrating the end portion of the stacked body of the first embodiment.
Figure 4B:
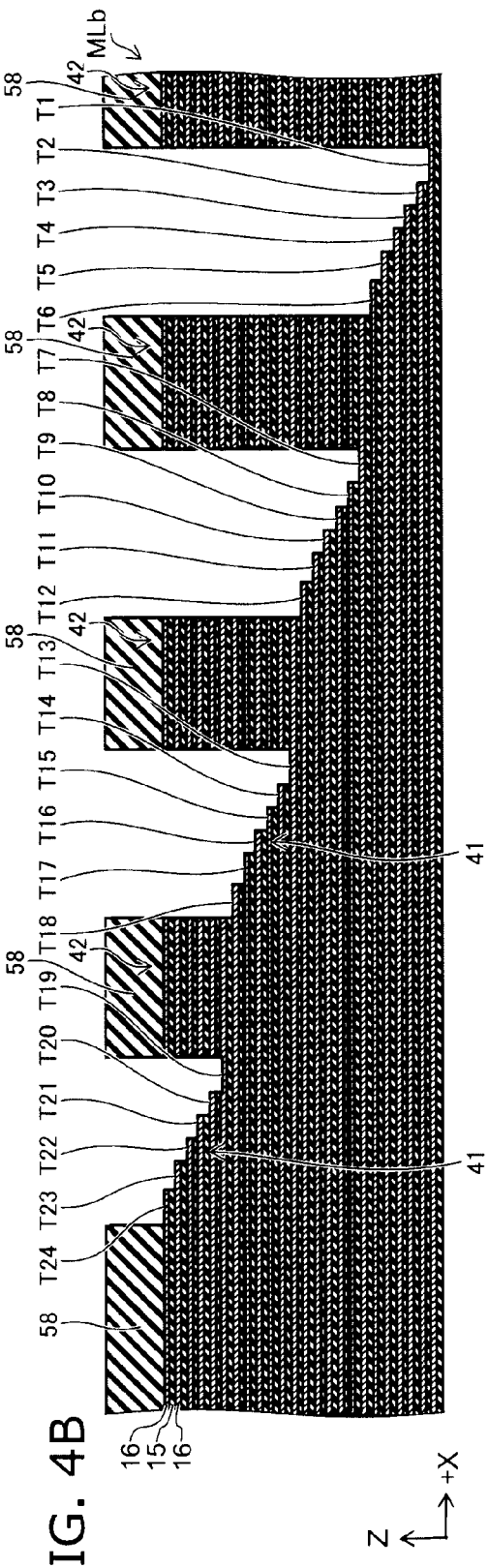
FIG. 4B is a cross-sectional view along line A-A' of FIG. 4A.
Figure 4C:
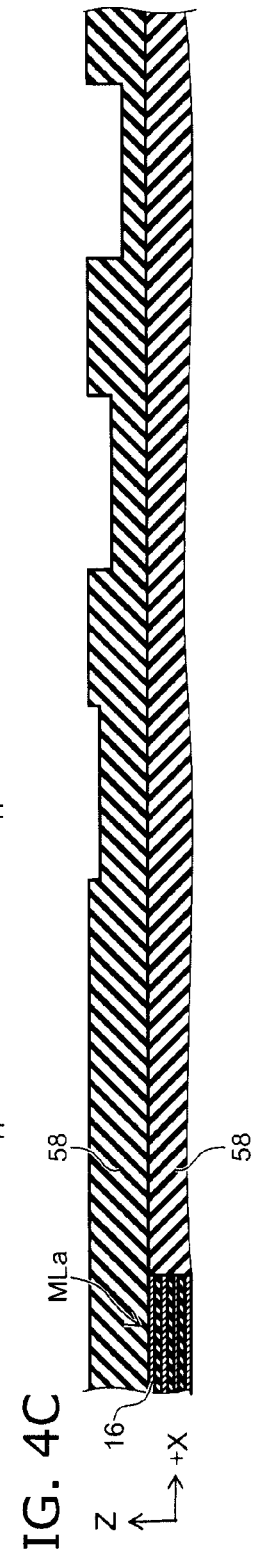
FIG. 4C is a cross-sectional view along line B-B' of FIG. 4A.

FIG. 4A is a plan view illustrating the end portion of the stacked body of this embodiment; FIG. 4B is a cross-sectional view along line A-A' of FIG. 4A; and FIG. 4C is a cross-sectional view along line B-B' of FIG. 4A.

Figure 5:
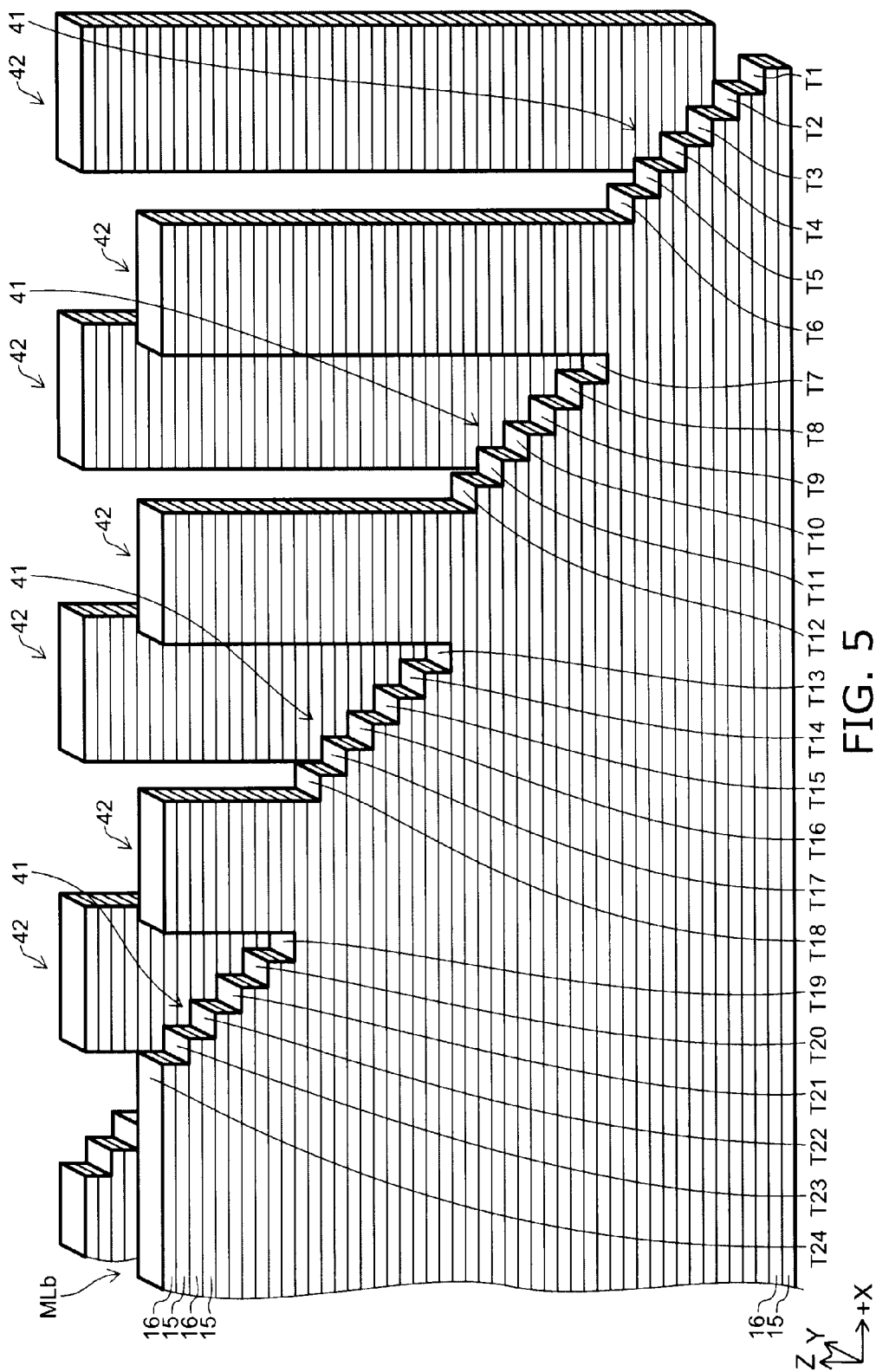
FIG. 5 is a perspective view illustrating the end portion of the stacked body of the first embodiment.

FIG. 5 is a perspective view illustrating the end portion of the stacked body of this embodiment.

Figure 6:
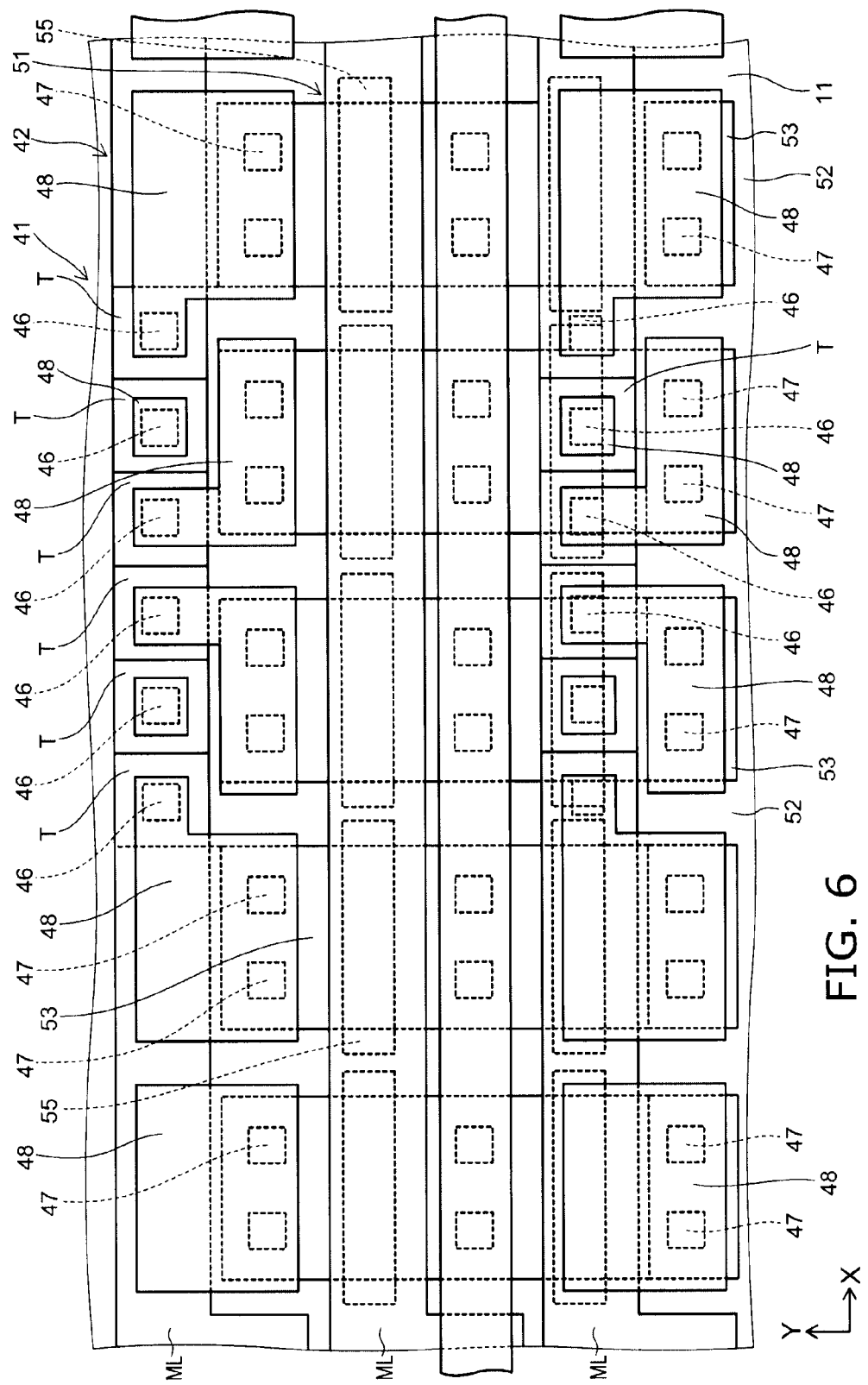
FIG. 6 is a plan view illustrating the end portion of the stacked body and interconnects thereabove of the first embodiment.

FIG. 6 is a plan view illustrating the end portion of the stacked body and interconnects thereabove of this embodiment.

Figure 7:
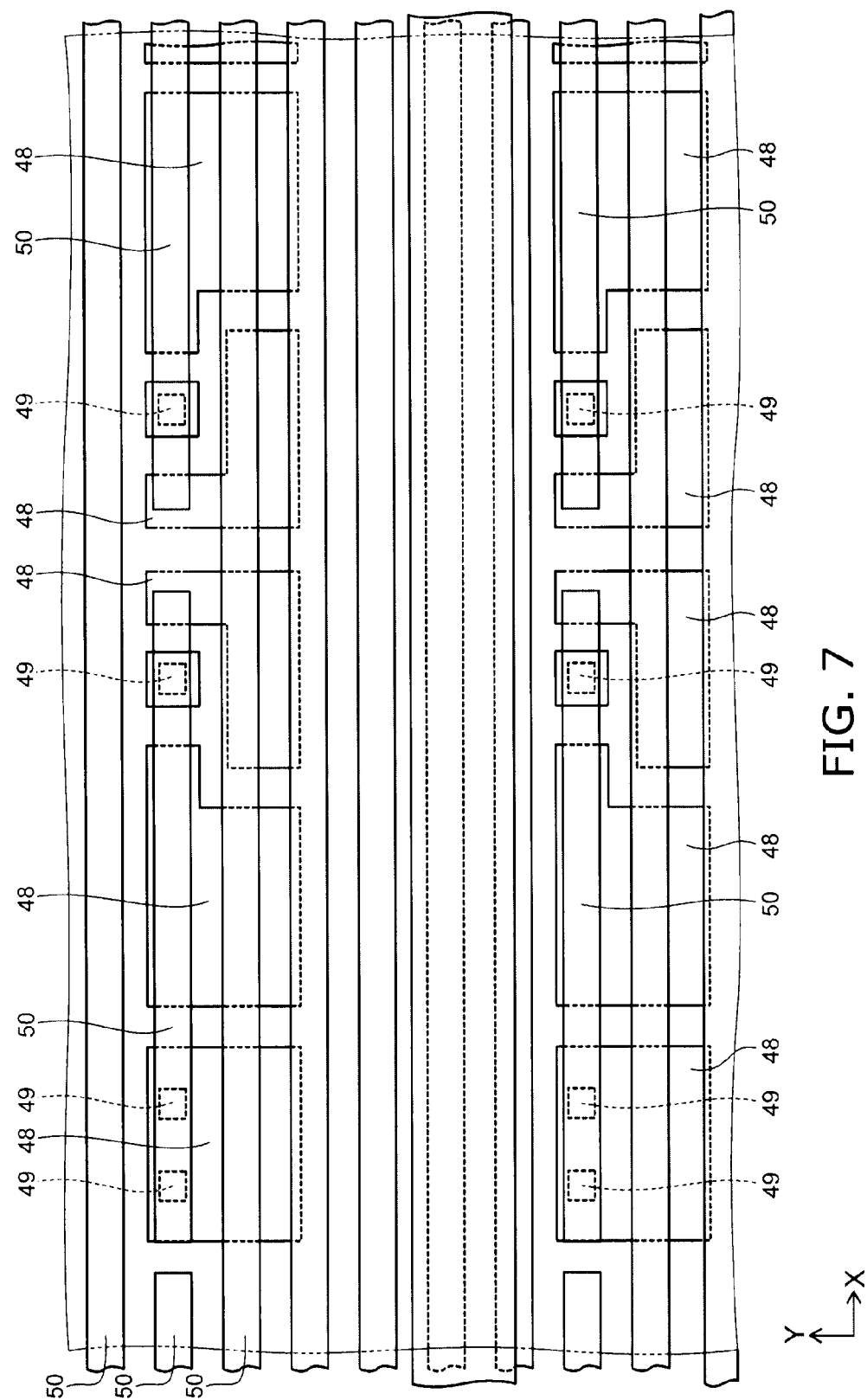
FIG. 7 is a plan view illustrating the end portion of the stacked body and the interconnects thereabove of the first embodiment.

FIG. 7 is a plan view illustrating the end portion of the stacked body and the interconnects thereabove of this embodiment.

Figure 8:
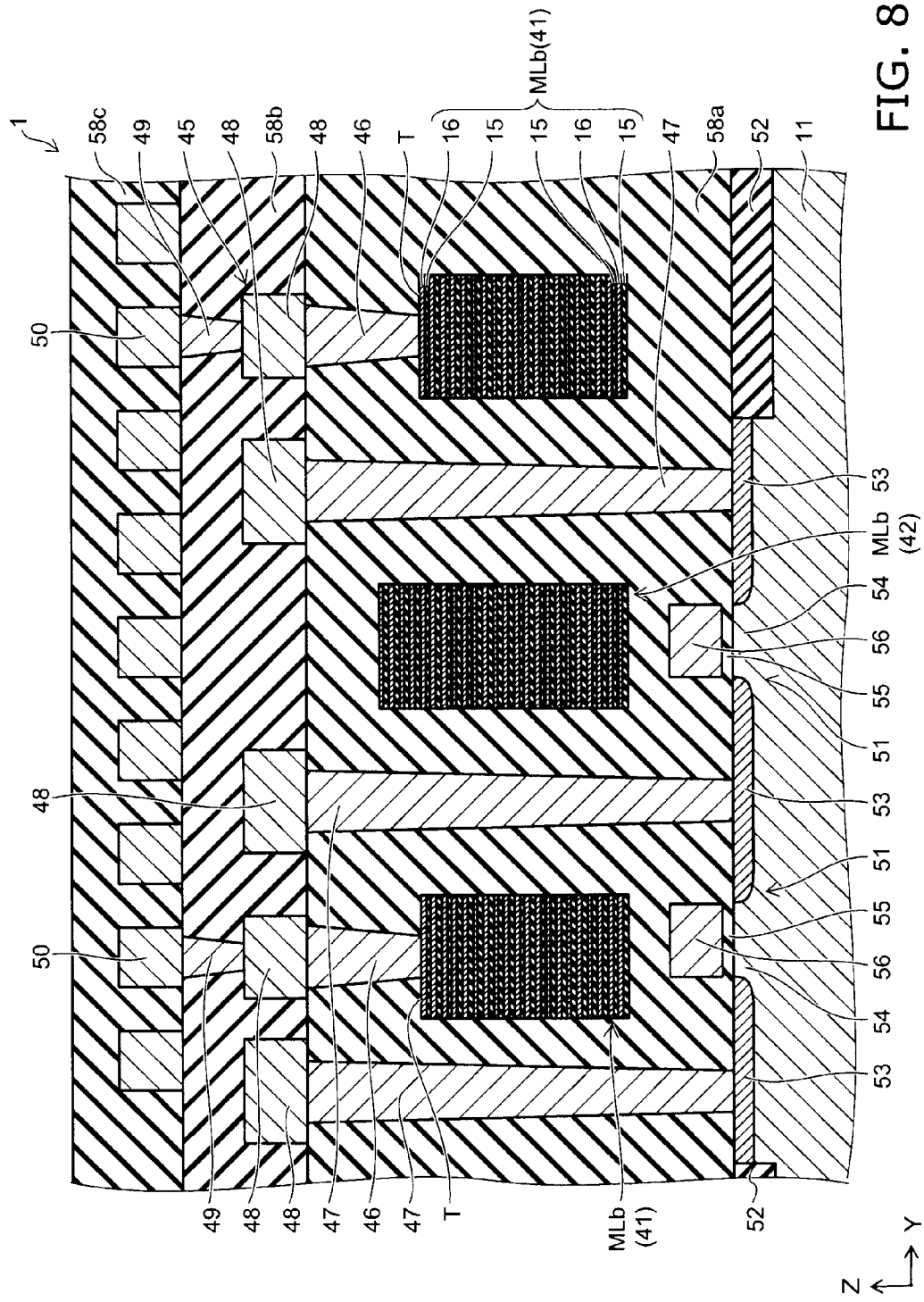
FIG. 8 is a cross-sectional view illustrating the end portion of the stacked body and the interconnects thereabove of the first embodiment.

FIG. 8 is a cross-sectional view illustrating the end portion of the stacked body and the interconnects thereabove of this embodiment.

As illustrated in FIG. 1, the semiconductor memory device (hereinbelow also referred to as simply the "device") 1 according to this embodiment includes a silicon substrate 11 made of, for example, monocrystalline silicon. Hereinbelow, an XYZ orthogonal coordinate system is introduced for convenience of description in the specification. In this coordinate system, two directions parallel to the upper face of the silicon substrate 11 and orthogonal to each other are taken as an X direction and a Y direction; and a direction orthogonal to both the X direction and the Y direction, i.e., the vertical direction, is taken as a Z direction.

In the device 1, multiple blocks B are set along the Y direction. One stacked body ML is provided on the silicon substrate 11 in each of the blocks B. In other words, multiple stacked bodies ML are arranged along the Y direction in the device 1. A memory region Rm, which includes memory cells that store data, and a peripheral circuit region Rc, which drives the memory cells of the memory region Rm, are set in each of the blocks B and arranged along the X direction. Each of the stacked bodies ML is disposed from the memory region Rm to the peripheral circuit region Rc; a central portion MLa of each of the stacked bodies ML is positioned in the memory region Rm; and an X-direction end portion MLb is positioned in the peripheral circuit region Rc.

First, the memory region Rm will be described.

As illustrated in FIG. 2, an insulating layer 12, a back gate electrode 13, and the stacked body ML are provided above the silicon substrate 11. The stacked body ML includes multiple insulating films 15 stacked alternately with multiple electrode films 16. Although only four layers of the electrode films 16 are illustrated for convenience of illustration in FIG. 2, more electrode films 16 are actually stacked. For example, twenty-four layers of the electrode films 16 are stacked in the stacked body ML.

A through-hole 20 is multiply made in the central portion MLa of the stacked body ML. The through-holes 20 pierce the stacked body ML and extend in the stacking direction (the Z direction) of the insulating films 15 and the electrode films 16. The through-holes 20 are arranged in a matrix configuration along the X direction and the Y direction as viewed from the Z direction. The two through-holes 20 mutually adjacent in the Y direction communicate with each other via a recess 13a made in the upper face of the back gate electrode 13.

A blocking insulating layer 21 is provided on the inner faces of the through-hole 20 and the recess 13a. The blocking insulating layer 21 is a layer that substantially does not allow a current to flow even when a voltage is applied within the range of the drive voltage of the device 1 and is formed of, for example, silicon oxide. A charge storage layer 22 is provided on the blocking insulating layer 21. The charge storage layer 22 is a layer capable of storing a charge, is a layer including trap sites of, for example, electrons, and is formed of, for example, silicon nitride. A tunneling insulating layer 23 is provided on the charge storage layer 22. Although the tunneling insulating layer 23 normally is insulative, the tunneling insulating layer 23 is a layer that allows a tunneling current to flow when a prescribed voltage within the range of the drive voltage of the device 1 is applied and is formed of, for example, silicon oxide. A memory film 24 is formed by stacking the blocking insulating layer 21, the charge storage layer 22, and the tunneling insulating layer 23.

Polysilicon is filled into the interiors of the through-hole 20 and the recess 13a. A silicon pillar 26 is formed of the polysilicon filled into the through-hole 20. The silicon pillar 26 has a columnar configuration, e.g., a circular columnar configuration, extending in the Z direction. On the other hand, a connection member 27 is formed of the polysilicon filled into the recess 13a. Two silicon pillars 26 mutually adjacent in the Y direction are electrically connected to each other by the connection member 27.

A selection gate electrode 28 extending in the X direction is provided on the stacked body ML; a source line 29 extending in the X direction is provided thereon; and a bit line 30 extending in the Y direction is provided thereon. One selected from the two silicon pillars 26 electrically connected to each other by the connection member 27 pierces the selection gate electrode 28 to be electrically connected to the source line 29; and the other of the two silicon pillars 26 pierces the selection gate electrode 28 to be electrically connected to the bit line 30 via a plug 31. By such a configuration, the charge storage layer 22 is disposed between the electrode films 16 and the silicon pillar 26; and a memory cell is formed for each intersection between the electrode films 16 and the silicon pillar 26. As a result, the multiple memory cells are arranged in a three-dimensional matrix configuration in the central portion MLa of the stacked body ML. In this embodiment, for example, the number of columns of the silicon pillars 26 in the Y direction is less than the number of stacks of the electrode films 16.

The peripheral circuit region Rc will now be described.

As illustrated in FIG. 3, the end portion MLb of the stacked body ML is disposed in the peripheral circuit region Rc. The end portion MLb extends in the X direction; and the width thereof, i.e., the length in the Y direction, is finer than the width of the central portion MLa. Therefore, the stacked body ML has, for example, an L-shape configuration as viewed from the Z direction. The end portion MLb of each of the stacked bodies ML has an intermittent stairstep configuration along the X direction.

In other words, in each of the end portions MLb as illustrated in FIG. 3 to FIG. 5, a stairstep portion 41 and a tower portion 42 are provided alternately along the X direction. In this embodiment, for example, four of the stairstep portions 41 and three or four of the tower portions 42 are provided. In mutually adjacent stacked bodies ML, the phases of the arrangements of the stairstep portion 41 and the tower portion 42 in the X direction are shifted one-half period. The stairstep portion 41 and the tower portion 42 are formed over the total length of the end portion MLb in the Y direction. Hereinbelow, in the end portion MLb, the direction away from the central portion MLa is taken as the "+X direction;" and the direction toward the central portion MLa is taken as the "−X direction." The "+X direction" and the "−X direction" are generally referred to as the "X direction."

Multiple, e.g., six, terraces T are formed in each of the stairstep portions 41 and are arranged in one column along only the X direction. Each of the terraces T includes the upper face of each of the electrode films 16 (referring to FIG. 8); and the upper face of each of the electrode films 16 is exposed at each of the terraces T. Although the electrode films 16 are not exposed to the atmosphere at the terraces T because the stacked body ML is buried with an inter-layer insulating film 58 (referring to FIG. 8), this state is described in the specification as "the upper faces of the electrode films 16 being exposed" because a portion of the outer face of the stacked body ML includes the upper faces of the electrode films 16 at the terraces T. On the other hand, all of electrode films 16 are stacked in the tower portion 42.

Hereinbelow, the terraces T of the levels also are referred to as the "terraces T1 to T24" in order from the lower side, i.e., from the proximity of the silicon substrate 11. The terrace T1 is a terrace including the upper face of the electrode film 16 of the lowermost level; and the terrace T24 is a terrace including the upper face of the electrode film 16 of the uppermost level. The terraces T1 to T24 are generally referred to as the "terrace T."

The electrode films 16 and the terraces T correspond one-to-one. In other words, the terrace T of one location includes one exposed layer of the electrode films 16; and one layer of the electrode films 16 is exposed at the terrace T of one location. The terrace T includes the upper face of the electrode film 16 of a lower level as the terrace T is positioned away from the central portion MLa of the stacked body ML. In other words, the level number of the exposed electrode film 16, i.e., the number when counted from the silicon substrate 11 side, is smaller as the terrace T is positioned in the +X direction. The level number of the electrode film 16 decreases one level and the number of stacks of the electrode films 16 in that portion decreases one layer as the terrace T moves once in the +X direction. This is similar inside each of the stairstep portions 41 and from one stairstep portion 41 to the next stairstep portion 41 with the tower portion 42 interposed therebetween.

A conductive member 45 is electrically connected to each of the terraces T to connect electrically the electrode film 16 to the silicon substrate 11 by leading out the electrode film 16 in the Y direction. The conductive member 45 is not illustrated in FIGS. 4A to 4C and FIG. 5. The configuration of the conductive member 45 will now be described specifically.

As illustrated in FIG. 6 to FIG. 8, one via 46 is provided in the region directly above each of the terraces T. The lower end of the via 46 is electrically connected to the electrode film 16 at the terrace T. On the other hand, a contact 47 extending in the Z direction is provided in the region between the end portions MLb mutually adjacent in the Y direction, i.e., the region on the Y-direction side as viewed from each of the end portions MLb. The lower end of the contact 47 is electrically connected to the silicon substrate 11. For example, the number of the contacts 47 is twice the number of the vias 46. While the vias 46 are disposed in only the region directly above the stairstep portion 41, the contacts 47 are disposed with substantially equal spacing along the total length of the end portion MLb.

A leading interconnect 48 is provided above the via 46 and the contact 47. The leading interconnect 48 is provided at the same height as the source line 29 (referring to FIG. 2) of the central portion MLa of the stacked body ML. The configuration of the leading interconnect 48 is rectangular or L-shaped as viewed from the Z direction. Each of the leading interconnects 48 is electrically connected to the upper end of one of the vias 46 and the upper ends of two of the contacts 47. Vias 49 are provided in a layer above the leading interconnects 48; and the lower ends of the vias 49 are electrically connected to a portion of the leading interconnects 48. An upper layer interconnect 50 is provided on the via 49 and is electrically connected to the upper end of the via 49. The upper layer interconnect 50 extends in the X direction and is provided at the same height as the bit line 30 (referring to FIG. 2) of the central portion MLa of the stacked body ML.

Thereby, a portion of the electrode films 16 is led out upward by the via 46, subsequently led out in the Y direction and the X direction by the leading interconnect 48, and electrically connected to the silicon substrate 11 via two of the contacts 47. The remaining electrode films 16 are led out upward by the via 46, the leading interconnect 48, and the via 49, led out in the X direction by the upper layer interconnect 50, electrically connected to one other leading interconnect 48 via one other via 49, led out in the Y direction by the one other leading interconnect 48, and electrically connected to the silicon substrate 11 via two of the contacts 47. Thus, the conductive member 45 includes the via 46, the leading interconnect 48, and the contacts 47 electrically connected in series from the electrode film 16 to the silicon substrate 11 or the via 46, the leading interconnect 48, the via 49, the upper layer interconnect 50, and the contacts 47 electrically connected in series from the electrode film 16 to the silicon substrate 11.

On the other hand, a drive circuit that drives the memory cells is formed below the stacked body ML in the peripheral circuit region Rc. A transistor 51 is multiply provided as a driver in the drive circuit. The gate length direction of the transistor 51 is the Y direction; and the transistor 51 is arranged along the X direction. In the transistor 51, source/drain regions 53 are formed in a region of the upper layer portion of the silicon substrate 11 partitioned by an element-separating insulator 52; and the region between a pair of the source/drain regions 53 forms a channel region 54. The gate insulating film 55 is formed on the silicon substrate 11; and a gate electrode 56 is provided in the region directly above the channel region 54 on the gate insulating film 55. The gate electrode 56 is provided at the same height as the back gate electrode 13 of the central portion MLa of the stacked body ML. The lower ends of the two of the contacts 47 electrically connected to each of the electrode films are electrically connected to one of the source/drain regions 53 of the transistor 51.

Then, the inter-layer insulating film 58 made of, for example, silicon oxide is provided on the silicon substrate 11 to bury the stacked body ML, the source line 29, the bit line 30, the via 46, the contact 47, the leading interconnect 48, the via 49, the upper layer interconnect 50, and the like. For convenience of illustration, the inter-layer insulating film 58 is not illustrated in FIG. 3, FIG. 5, FIG. 6, and FIG. 7. Only the upper layer interconnect 50, the via 49, the leading interconnect 48, and the silicon substrate 11 are illustrated in FIG. 7.

A method for manufacturing the semiconductor memory device according to this embodiment will now be described.

FIG. 9A to FIG. 13C are views of processes, illustrating the method for manufacturing the semiconductor memory device according to this embodiment. In each of the drawings, drawing A is a plan view illustrating one stacked body; drawing B is a cross-sectional view along line A-A' of drawing A; and drawing C is a cross-sectional view along line B-B' of FIG. A.

First, as illustrated in FIG. 2 and FIG. 8, the element-separating insulator 52 is selectively formed in the upper layer portion of the silicon substrate 11; and diffusion regions such as the source/drain regions 53 are formed in the region partitioned by the element-separating insulator 52. Then, the insulating layer 12 and the gate insulating film 55 are formed on the silicon substrate 11; a conductive film is formed; and the conductive film is patterned. Thereby, the portion of the conductive film formed in the memory region Rm is used to form the back gate electrode 13; and the portion formed in the peripheral circuit region Rc is used to form the gate electrode 56. Thereby, the transistor 51 is formed as a driver in the peripheral circuit region Rc; and the drive circuit is formed. Then, the recess 13a is made in the upper face of the back gate electrode 13; and a sacrificial member (not illustrated) is filled into the interior thereof.

Then, the insulating films 15 and the electrode films 16 are stacked alternately. Continuing, the stacked body made of the insulating films 15 and the electrode films 16 is divided into the blocks B (referring to FIG. 1) by etching such as, for example, RIE (reactive ion etching). Thereby, the multiple stacked bodies ML arranged along the Y direction are formed. At this time, the width of the end portion MLb of the stacked body ML, i.e., the length in the Y direction, is shorter than the width of the central portion MLa.

Continuing as illustrated in FIGS. 9A and 9B, an inter-layer insulating film 58a is deposited to bury the stacked body ML; and the upper face is planarized. Then, for example, silicon oxide is deposited on the stacked body ML and the inter-layer insulating film 58a to form a hard mask 61. Then, an opening 61a is made in the region of the hard mask 61 directly on the region where the stairstep portion 41 (referring to FIG. 3) is to be formed. In other words, the openings 61a are disposed intermittently along the X direction in the end portion MLb of each of the stacked bodies ML and are disposed to be different between the stacked bodies ML.

Then, as illustrated in FIGS. 10A and 10B, the resist film is formed to cover the hard mask 61. The film thickness of the resist film is, for example, 3 μm. The resist film may be formed by coating a chemically amplified photoresist having homogeneous characteristics or by coating to stack resists having different sensitivities in order from the lower sensitivities to the higher sensitivities. Then, lithography using i-rays is performed; and the resist film is patterned. At this time, the exposure is performed using a different exposure amount for each portion of the resist film by using a photomask in which a grating pattern is formed. Thereby, the remaining film thickness of the resist film after the development changes in stages along the X direction; and a resist pattern 62 having a stairstep configuration in which the film thickness is thinner toward the +X direction is formed. Thereby, the film thickness of the resist pattern 62 is different for the region directly above each of the openings 61a; the opening 61a is covered with a thinner resist pattern 62 as the opening 61a is positioned on the +X direction side; and the opening 61a furthest on the +X direction side is not covered with the resist pattern 62.

Figures 11A, 11B, 11C:
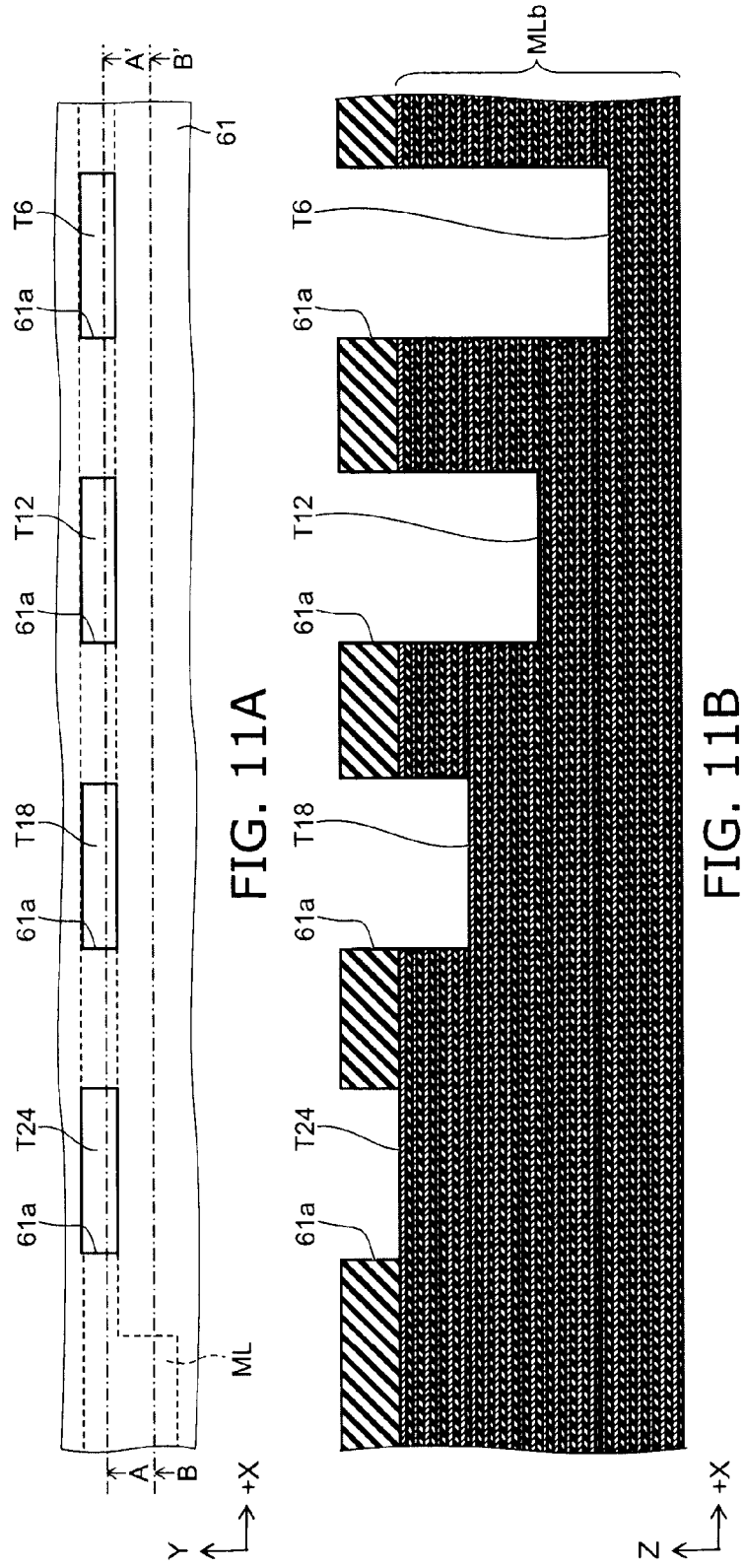
FIG. 11A to FIG. 11C are views of processes, illustrating the method for manufacturing the semiconductor memory device according to the first embodiment.

Continuing as illustrated in FIGS. 11A and 11B, etching such as RIE is performed using the resist pattern 62 (referring to FIG. 10A to 10C) and the hard mask 61 as a mask. Thereby, n layers (n being an integer not less than 2) of the electrode films 16 and n layers of the insulating films 15, e.g., six layers each, are selectively removed in the region not covered with the resist pattern 62 or the hard mask 61, i.e., the region directly under the opening 61a made furthermost on the +X direction side.

Then, slimming of the resist pattern 62 (referring to FIG. 10A to 10C) is performed using, for example, oxygen (O$_2$) plasma; and the thinnest portion of the resist pattern 62 vanishes. Thereby, in addition to the opening 61a positioned furthermost on the +X direction side, the opening 61a positioned second furthest on the +X direction side also is no longer covered with the resist pattern 62. Then, etching is performed using the resist pattern 62 and the hard mask 61 as a mask. Thereby, six layers of the electrode films 16 and six layers of the insulating films 15 are removed in the region directly under the opening 61a not covered with the resist pattern 62. As a result, a total of twelve layers of the electrode films 16 and twelve layers of the insulating films 15 are removed from the region directly under the opening 61a positioned furthermost on the +X direction side; and six layers of the electrode films 16 and six layers of the insulating films 15 are removed from the region directly under the opening 61a positioned second furthest on the +X direction side.

Continuing, slimming of the resist pattern 62 is performed again; and etching is performed subsequently. Thereby, the opening 61a of one more location is not covered with the resist pattern 62; and six more layers of the electrode films 16 and six more layers of the insulating films 15 are removed in the region directly under each of the openings 61a. As a result, a total of eighteen layers of the electrode films 16 and eighteen layers of the insulating films 15 are removed from the region directly under the opening 61a furthermost on the +X direction side; a total of twelve layers of the electrode films 16 and twelve layers of the insulating films 15 are removed from the region directly under the opening 61a positioned second furthest on the +X direction side; and six layers of the electrode films 16 and six layers of the insulating films 15 are removed from the opening 61a positioned third furthest on the +X direction side. Thereby, a portion of the end portion MLb is patterned into a stairstep configuration; and six layers of the electrode films 16 which are different for each region are exposed in each of the regions directly under the openings 61a of four locations arranged along the X direction. Subsequently, the resist pattern 62 is removed.

Then, as illustrated in FIGS. 12A and 12B, a resist film is coated onto the hard mask 61. Patterning is performed using lithography to form a resist pattern 63. Openings 63a are made in regions of the resist pattern 63 including the end edges on the +X direction side of the openings 61a of the hard mask 61. In other words, the opening 63a is made in four locations along the X direction; the electrode film 16 is exposed in a region on the -X direction side of the bottom of each of the openings 63a; and the hard mask 61 is exposed in the remaining region of the bottom of each of the openings 63a.

Continuing as illustrated in FIGS. 13A and 13B, etching such as RIE using the resist pattern 63 and the hard mask 61 as a mask is performed. Thereby, one layer of the electrode films 16 and one layer of the insulating films 15 are removed at each of the levels of the region not covered with the resist pattern 63 or the hard mask 61, i.e., the portion patterned into the stairstep configuration in the process illustrated in FIGS. 11A and 11B. Then, slimming of the resist pattern 63 is performed using, for example, oxygen plasma to enlarge the openings 63a. Thereby, the end edge of the opening 63a on the -X direction side inside the opening 61a is caused to recede in the -X direction.

Thereafter, the etching that removes one layer of the electrode films 16 and one layer of the insulating films 15 and the slimming of the resist pattern 63 described above are repeated. As a result, as the end edge of the opening 63a moves in the −X direction in the region directly under each of the openings 61a, one layer of the electrode films 16 and one layer of the insulating films 15 are removed alternately to pattern a stairstep configuration in which the level number of the electrode film 16 decreases one level for each movement in the +X direction. Thereby, the region directly under the opening 61a in the end portion MLb forms the stairstep portion 41. On the other hand, the portion covered with the hard mask 61 with all of the electrode films 16 remaining forms the tower portion 42. In this embodiment, n levels, e.g., six levels, of the terraces T are formed inside each of the openings 61a by alternately implementing RIE (n−1) times, e.g., five times, and slimming (n−2) times, e.g., four times. Subsequently, the resist pattern 63 is removed.

In the processes illustrated in FIGS. 11A and 11B as described above, the level number of the exposed electrode film 16 in the opening 61a differs by six levels between the openings 61a. In this process, the level number of the exposed electrode film 16 inside each of the openings 61a differs by one level at a time to form the six terraces T. As a result, a total of twenty-four terraces T1 to T24 are formed; and each of the electrode films 16 is exposed at one of the terraces T.

Then, as illustrated in FIG. 1 to FIG. 8, a hard mask (not illustrated) is formed on the stacked body ML; and the through-holes 20 extending in the Z direction are made in the central portion MLa of the stacked body ML to reach both end portions of the recess 13a by etching the mask. Then, the sacrificial member inside the recess 13a is removed; and the blocking insulating layer 21, the charge storage layer 22, and the tunneling insulating layer 23 are formed in this order on the inner faces of the through-hole 20 and the recess 13a. Continuing, the connection member 27 and the silicon pillar 26 are formed by filling polysilicon into the interiors of the recess 13a and the through-hole 20. Then, the selection gate electrode 28 is formed on the central portion MLa of the stacked body ML.

Continuing, in the peripheral circuit region Rc, a contact hole and a via hole are made in the inter-layer insulating film 58a. The contact hole is made in the region between the end portions MLb of the stacked body ML to reach the silicon substrate 11. The via hole is made in the region directly above each of the terraces T of the end portion MLb to reach the exposed electrode film 16 at each of the terraces T. Then, a conductive material such as, for example, tungsten is filled into the contact hole and the via hole. Thereby, the contact 47 is formed inside the contact hole; and the via 46 is formed inside the via hole.

Then, a conductive film is formed on the entire surface and patterned to form the source line 29 in the memory region Rm and the leading interconnect 48 in the peripheral circuit region Rc. Then, an inter-layer insulating film 58b is formed on the inter-layer insulating film 58a; and the upper face thereof is planarized using CMP (chemical mechanical polishing) and the like. Continuing, the plug 31 is formed in the memory region Rm and the via 49 is formed in the peripheral circuit region Rc by making a via hole in the inter-layer insulating film 58b and filling a conductive material. Then, the bit line 30 is formed in the memory region Rm and the upper layer interconnect 50 is formed in the peripheral circuit region Rc by forming a conductive film on the entire surface and patterning the conductive film. The conductive member 45 is formed by forming the via 46, the contact 47, the leading interconnect 48, the via 49, and the upper layer interconnect 50. Then, an inter-layer insulating film 58c is formed. The inter-layer insulating film 58 is formed of the hard mask 61 and the inter-layer insulating films 58a, 58b, and 58c. Thereby, the semiconductor memory device 1 according to this embodiment is manufactured.

Operational effects of this embodiment will now be described.

In this embodiment, the end portion MLb of the stacked body ML is formed in the peripheral circuit region Rc; and each of the electrode films 16 included in the stacked body ML is exposed at one of the terraces T arranged in the X direction in the end portion MLb. In other words, the exposed portions of the electrode films 16 are arranged along the X direction in the peripheral circuit region Rc. The exposed electrode film 16 at the terrace T is electrically connected to a portion of the drive circuit formed in the silicon substrate 11, e.g., the source/drain region 53 of the transistor 51, by being led out in the Y direction by the conductive member 45.

Thereby, the conductive members 45 that electrically connect the electrode films 16 to the silicon substrate 11 can be arranged along the X direction. Accordingly, even in the case where the number of stacks of the electrode films 16 of the stacked body ML is increased, it is sufficient only for the length of the end portion MLb in the X direction to be increased; and it is unnecessary to increase the length of the stacked body ML in the Y direction. Therefore, the number of stacks of the electrode films 16 can be determined regardless of the length of the stacked body ML in the Y direction. Thereby, the number of the memory cells included in one block B can be selected arbitrarily. Normally, because the erasing of the data stored in the memory cells is performed for the unit of a block, the handling of the data is more complex and the operation efficiency of the device 1 decreases in the case where the number of the memory cells included in one block is too great. According to this embodiment, the number of the memory cells included in one block can be selected arbitrarily. Therefore, the handling of the data is easy and a high operation efficiency can be maintained even in the case where the number of stacks of the electrode films 16 is increased.

Conversely, it would be necessary for the leading interconnect that electrically connects each of the electrode films 16 to the silicon substrate 11 to be lengthened in the +X direction if the stacked body ML is provided only in the memory region Rm, the end portion MLb of the stacked body ML has a simple stairstep configuration in which the level number decreases one level at a time toward the +X direction, and each of the terraces is formed over the total length of the stacked body ML in the Y direction. Also, it would be necessary for the leading interconnects to be arranged along the Y direction so that the leading interconnects do not contact each other. Further, it would be necessary to provide the same number of leading interconnects as electrode films 16. Therefore, in the case where the number of stacks of the electrode films 16 of the stacked body ML is increased, the length of the stacked body ML in the Y direction would undesirably increase proportionally thereto. In such a case, because the memory cells are arranged in a three-dimensional matrix configuration, the number of the memory cells included in each of the blocks increases proportionally to the square of the number of stacks of the electrode films 16. Therefore, in the case where the number of stacks of the electrode films 16 is great, the number of the memory cells included in one block becomes too great and the handling of the data is unfortunately difficult.

In this embodiment, the tower portion 42 is provided in the end portion MLb of the stacked body ML; and the stairstep portion 41 is disposed in a scattered configuration. Therefore, in the processes after the forming of the end portion MLb, it is easy to planarize the inter-layer insulating film and the like. For example, in the case where the total film thickness of the stacked body ML is about 2 μm, it is necessary to deposit the insulating material with a thickness of not less than 2 μm to bury the stacked body ML in the case where the tower portion 42 is not provided in the end portion MLb of the stacked body ML. In such a case, it is necessary to use a method such as CMP to planarize the insulating material deposited with a thickness of not less than 2 μm on the stacked body ML. Conversely, according to this embodiment, the width of the stairstep portion 41 is, for example, about 0.6 μm. Therefore, complete burying is possible by depositing the insulating material with a thickness of about 0.5 μm. In such a case, it is unnecessary to use CMP to planarize; and planarizing can be performed easily using a method such as etch-back by RIE. As a result, the semiconductor memory device 1 can be downscaled even further and can have higher yields and reliability.

According to this embodiment, the multiple openings 61a are made separated from each other in the hard mask 61; and the resist pattern 62 is formed in a stairstep configuration by using the photomask in which the grating pattern is formed. Thereby, the thickness of the resist pattern 62 can be different for each of the openings 61a. As a result, the receded amount of the end edge of the resist pattern 62 in the −X direction can be greater than the reduction amount of the film thickness of the resist pattern 62, i.e., the amount receded in the Z direction, when performing the slimming of the resist pattern 62. Therefore, it is possible to use one resist pattern 62 to provide a different etching amount of the stacked body ML for each of the multiple openings 61a arranged to be separated in the X direction. Subsequently, the stairstep portion 41 can be formed for each of the openings 61a by making the opening 63a of the resist pattern 63 for each of the openings 61a of the hard mask 61 and by repeating the enlargement of the openings 63a and the removal of the electrode films 16.

By such methods according to this embodiment, the stairstep portion 41 and the tower portion 42 can be formed in the end portion MLb of the stacked body ML by a total of three lithography processes, that is, the lithography process to make the opening 61a in the hard mask 61, the lithography process to form the resist pattern 62, and the lithography process to make the opening 63a in the resist pattern 63. Therefore, the semiconductor memory device 1 according to this embodiment has low manufacturing costs.

A second embodiment will now be described.

Figure 14:
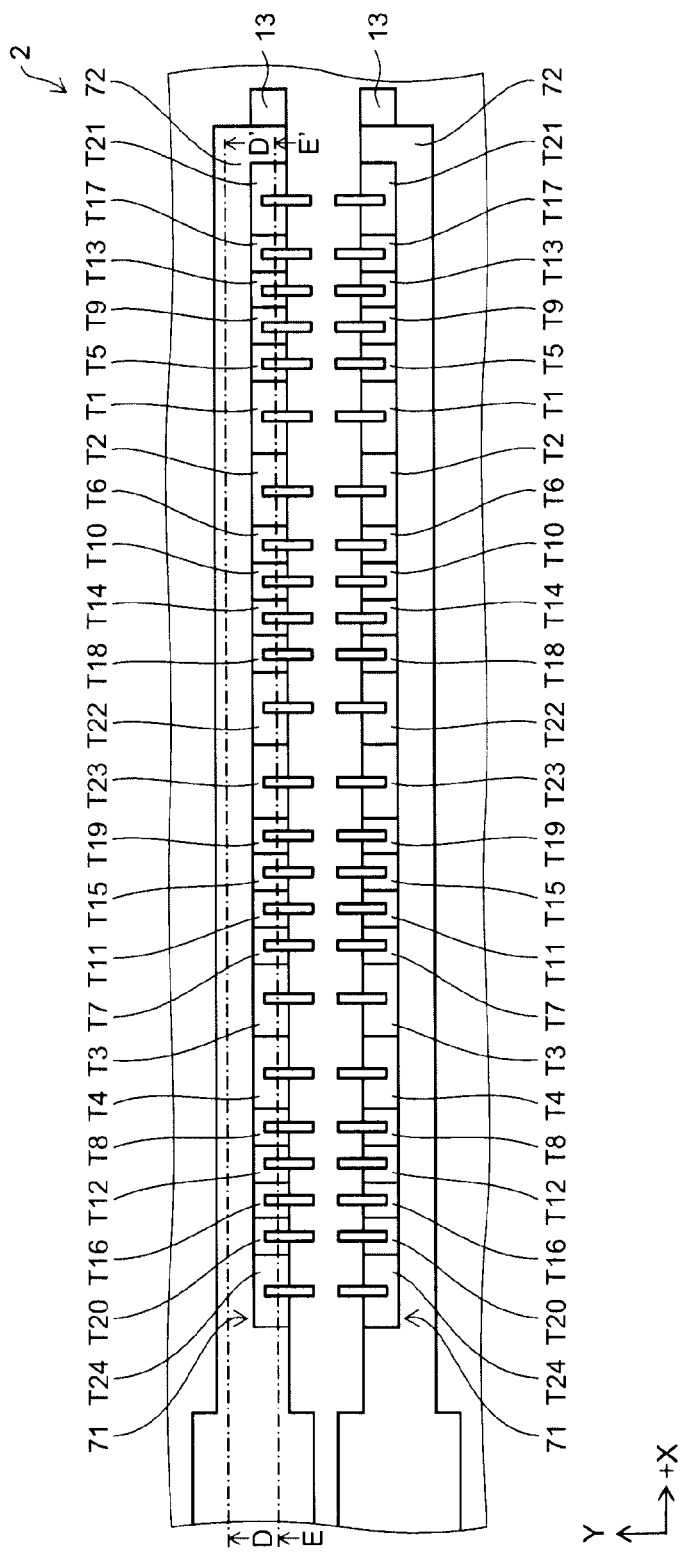
FIG. 14 is a plan view schematically illustrating an end portion of a stacked body of a second embodiment.

FIG. 14 is a plan view schematically illustrating the end portion of the stacked body of this embodiment.

FIGS. 15A and 15B are cross-sectional views illustrating the end portion of the stacked body of this embodiment; FIG. 15A is a cross-sectional view along line D-D' of FIG. 14; and FIG. 15B is a cross-sectional view along line E-E' of FIG. 14.

In the semiconductor memory device 2 according to this embodiment as illustrated in FIG. 14 and FIGS. 15A and 15B, the configuration of the end portion MLb of the stacked body ML is different from that of the first embodiment described above. In other words, in this embodiment, a stairstep portion 71 is formed on one width-direction (Y-direction) side of the end portion MLb; and a tower portion 72 is formed on the opposite width-direction side of the end portion MLb. In other words, in each of the end portions MLb, one stairstep portion 71 and one tower portion 72 are formed extending in the X direction. All of electrode films 16 remain in the tower portion 72.

In the stairstep portion 71, the same number of the terraces T as the number of stacks of the electrode films 16, e.g., twenty-four levels, are formed and arranged in one column along the X direction. The terraces T in the XZ plane are arranged in a wave-like configuration to form valleys in two locations. The level number of the exposed electrode film 16 at the terrace T changes four at a time at the slopes of each of the valleys; and at the bottom of the valley and at the peak between the valleys, the level number of the electrode film 16 decreases by only one when proceeding to the next terrace in the +X direction. Otherwise, the configuration of this embodiment is similar to that of the first embodiment described above.

A method for manufacturing the semiconductor memory device according to this embodiment will now be described.

FIGS. 16A and 16B and FIGS. 17A and 17B are process plan views illustrating the method for manufacturing the semiconductor memory device according to this embodiment.

First, using methods similar to those of the first embodiment described above, the drive circuit is formed in the silicon substrate 11; and the stacked body ML is formed on the silicon substrate 11 and divided into blocks.

Figure 16A:
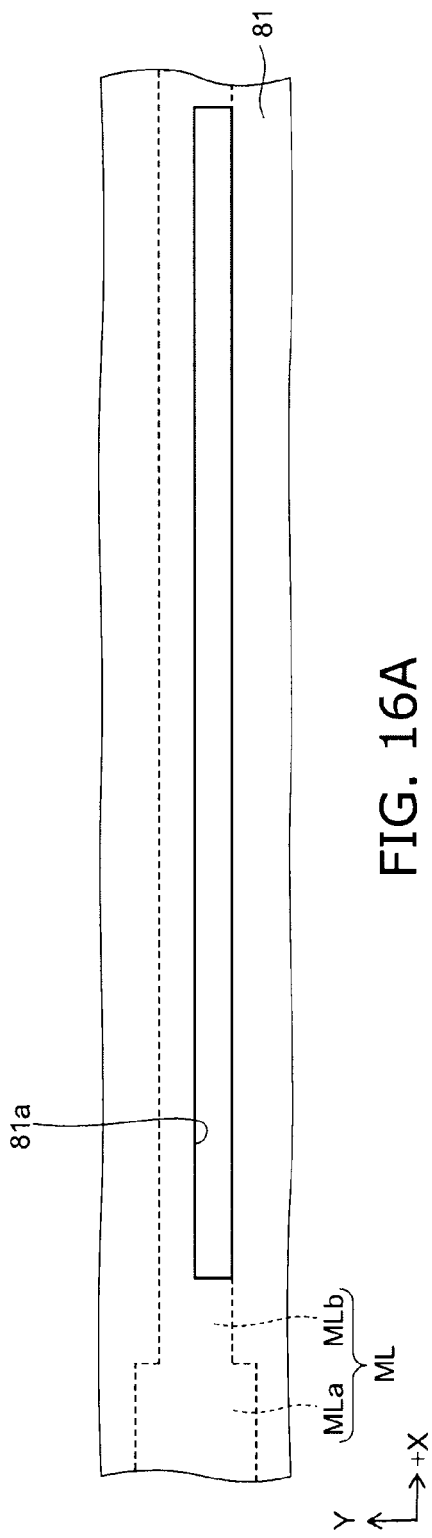
FIGS. 16A and 16B are process plan views illustrating a method for manufacturing the semiconductor memory device according to the second embodiment.

Then, as illustrated in FIG. 16A, an inter-layer insulating film (not illustrated) is formed to bury the stacked body ML divided into the blocks. Continuing, a hard mask 81 made of, for example, silicon oxide is formed on the stacked body ML and on the inter-layer insulating film. An opening 81a is made in the hard mask 81. The opening 81a is made in the region directly above the region where the stairstep portion 71 is to be formed. In other words, the opening 81a is made in one location in the region directly above one width-direction side of the end portion MLb to extend in the X direction.

Figure 16B:
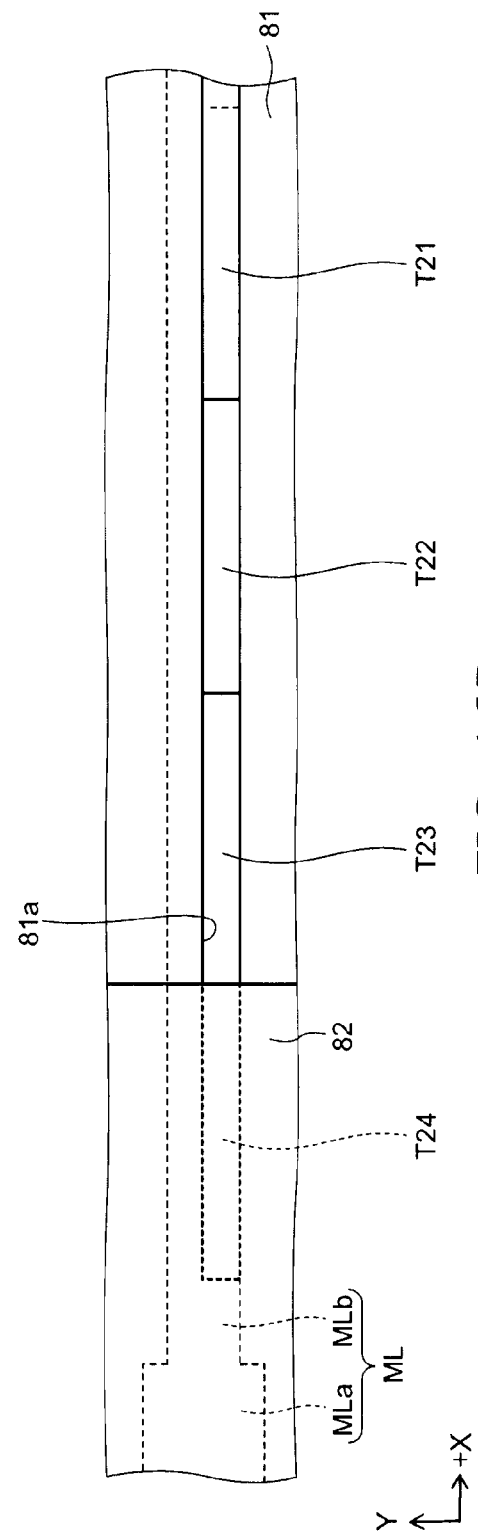

Continuing as illustrated in FIG. 16B, a resist pattern 82 is formed on the hard mask 81. The resist pattern 82 is formed into a stairstep configuration using a photomask in which a grating pattern is formed. The positions where the level of the resist pattern 82 changes are positioned in the regions directly above the opening 81a of the hard mask 81. Then, one layer of the electrode films 16 and one layer of the insulating films 15 are removed by performing etching such as RIE using the resist pattern 82 and the hard mask 81 as a mask. Continuing, slimming of the resist pattern 82 is performed to remove the thinnest portion. At this time, the end edge of the resist pattern 82 on the +X direction side is positioned in the region directly above the opening 81a.

Subsequently, by alternately performing RIE and slimming, the portion corresponding to the region directly under the opening 81a of the end portion MLb of the stacked body ML is patterned into a stairstep configuration. Specifically, changes in levels occur in three locations in which the level number of the exposed electrode film 16 decreases one level at a time when proceeding in the +X direction by performing RIE three times and slimming twice. Thereby, the four terraces T24, T23, T22, and T21 are formed toward the +X direction inside opening 81a. Subsequently, the resist pattern 82 is removed.

Then, as illustrated in FIG. 17A, a resist pattern 83 is formed on the hard mask 81. Two openings 83a are made in the resist pattern 83. The openings 83a are made in the region including the position where the end edge of the resist pattern 82 on the +X direction side is positioned when performing the etching illustrated in FIG. 16B. Specifically, one of the openings 83a is made in the region including the boundary between the terrace T24 and the terrace T23; and the other one of the openings 83a is made in the region including the boundary between the terrace T22 and the terrace T21.

Continuing as illustrated in FIG. 17B, four layers of the electrode films 16 and four layers of the insulating films 15 are removed by performing RIE using the resist pattern 83 and the hard mask 81 as a mask. Then, slimming of the resist pattern 83 is performed to enlarge the openings 83a. At this time, the end edge of the opening 83a on the −X direction side is caused to recede in the −X direction; and the end edge on the +X direction side is caused to recede in the +X direction. Thereafter, differences in levels corresponding to four layers of the electrode films 16 and four layers of the insulating films 15 are formed on both X-direction sides inside each of the openings 83a by alternately performing RIE and slimming. Thus, the end portion MLb can be patterned into a valley-like configuration by utilizing both the end edge of the opening 83a on the −X direction side and the end edge of the opening 83a on the +X direction side. Thereby, the stairstep portion 71 is formed. On the other hand, the portion that is covered with the hard mask 81 and not etched forms the tower portion 72. Subsequently, the resist pattern 83 is removed.

The subsequent manufacturing method is similar to that of the first embodiment described above. Thereby, the semiconductor memory device 2 according to this embodiment is manufactured. Otherwise, the manufacturing method of this embodiment is similar to that of the first embodiment described above. In this embodiment as well, effects similar to those of the first embodiment described above can be obtained.

A third embodiment will now be described.

Figure 18:
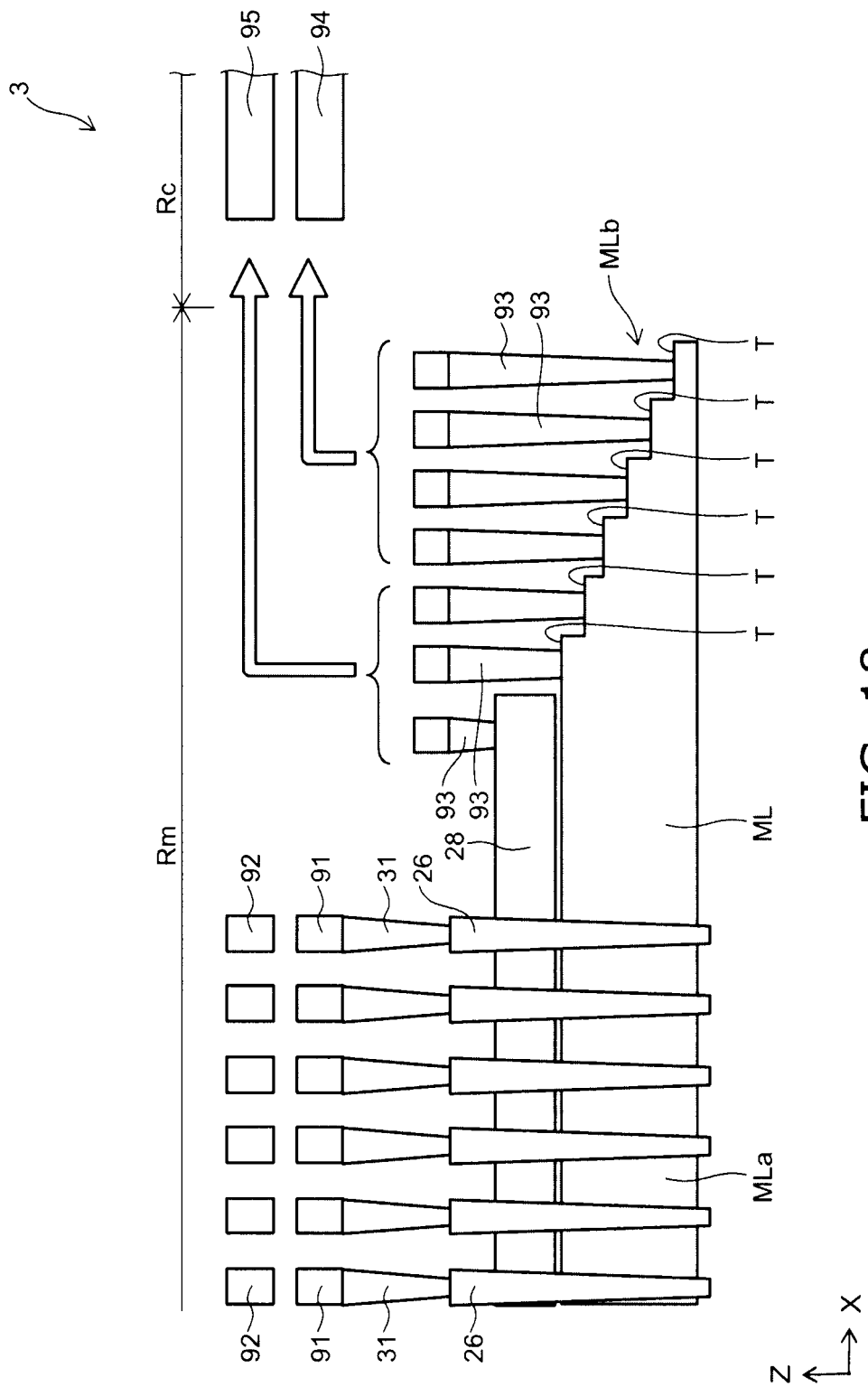
FIG. 18 is a cross-sectional view schematically illustrating a semiconductor memory device according to a third embodiment.

FIG. 18 is a cross-sectional view schematically illustrating the semiconductor memory device according to this embodiment.

In the semiconductor memory device 3 according to this embodiment as illustrated in FIG. 18, the bit lines are provided in two interconnect layers. In other words, a local bit line 91 is provided in the interconnect layer of the lower side. The local bit line 91 extends in the Y direction and is disposed over about one to several blocks. A global bit line 92 is provided in the interconnect layer of the upper side. Although the global bit line 92 also extends in the Y direction, the global bit line 92 is disposed over the entire semiconductor memory device 3.

Further, in this embodiment, the stacked body ML is provided in only the memory region Rm; and the end portion MLb of the stacked body ML has a simple stairstep configuration in which the level number decreases one level at a time away from the central portion MLa. In the end portion MLb, the same number of terraces T as electrode films 16 (referring to FIG. 2) are formed over the total length of the stacked body ML in the Y direction. Then, a contact 93 is provided in the region directly above each of the terraces T and is electrically connected to the electrode film at the terrace T. Leading interconnects 94 and 95 extending in the X direction are provided on the contacts 93. The leading interconnect 94 is provided in the same interconnect layer as the local bit line 91; and the leading interconnect 95 is provided in the same interconnect layer as the global bit line 92. A portion of the contacts 93 is electrically connected to the leading interconnects 94; and the remaining contacts 93 are electrically connected to the leading interconnects 95. Other interconnects and vias may be electrically connected from the contact 93 to the leading interconnect 94 and from the contact 93 to the leading interconnect 95.

According to this embodiment, the electrode films 16 can be led out by the leading interconnects 94 and 95 formed in the two interconnect layers. Therefore, the width of the block, i.e., the length in the Y direction, can be reduced to about half of that of the case where the leading out uses only one leading interconnect layer. Thereby, the number of the memory cells belonging to each of the blocks can be reduced; and the handling of the data can be easy. Otherwise, the configuration and manufacturing method of this embodiment are similar to those of the first embodiment described above.

This embodiment is practicable in combination with the first or second embodiments described above. In other words, the bit lines may be formed in two layers while the configuration of the end portion MLb of the stacked body ML is the configuration described in the first or second embodiments described above. Thereby, the degrees of freedom of the layout of the conductive member 45 (referring to FIG. 3) that electrically connects the electrode film 16 to the silicon substrate 11 increase.

According to the embodiment described above, a semiconductor memory device and a method for manufacturing the same can be realized in which the handling of the data is easy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
a stacked body provided above the substrate, the stacked body including a plurality of insulating films stacked alternately with a plurality of electrode films;
conductive members connecting electrically the electrode films to the substrate;
a semiconductor pillar provided in a first portion of the stacked body and extending in a stacking direction of the insulating films and the electrode films;
a charge storage layer provided between the electrode film and the semiconductor pillar; and
a plurality of terraces being formed in each of a plurality of second portions of the stacked body, the plurality of terraces being configured with upper faces of the electrode films respectively, the plurality of terraces being arranged along only a first direction and configuring a stairstep configuration in each of the second portions, the second portions being arranged along a second direction,
each of the conductive members being lead out from each of the terraces along the second direction, and
the first direction and the second direction being parallel to the upper face of the substrate and intersecting each other,
wherein a length of the second portion in the second direction is shorter than a length of the first portion in the second direction.

2. The device according to claim 1, wherein the conductive member electrically connects the electrode film to a source/drain region of a transistor formed in the substrate.

3. The device according to claim 1, wherein the second portion includes a stairstep portion and a tower portion, a plurality of the terraces are formed in the stairstep portion, and all of the electrode films are stacked in the tower portion.

4. The device according to claim 3, wherein a level of the upper face of the electrode film configures the terrace decreases as the terrace is positioned away from the first portion.

5. The device according to claim 4, wherein the stairstep portion and the tower portion are formed over the total length of the second portion in the second direction and arranged alternately along the first direction.

6. The device according to claim 3, wherein the stairstep portion is formed on one second-direction side of the second portion, and the tower portion is formed on one other second-direction side of the second portion.

7. The device according to claim 1, wherein
the conductive member includes:
a via connected electrically to the upper face of the electrode film;
a contact provided on the second-direction side as viewed from the end portion, a lower end of the contact being electrically connected to the substrate; and
an interconnect electrically connecting an upper end portion of the via to an upper end portion of the contact.

8. The device according to claim 1, further comprising:
another stacked body provided above the substrate, the other stacked body being disposed in a region apart from the stacked body in the second direction, the other stacked body including a plurality of insulating films stacked alternately with a plurality of electrode films.

9. The device according to claim 1, wherein
the second portions are provided in an end portion of the stacked body on the first direction side.

10. A semiconductor memory device, comprising:
a substrate;
a stacked body provided above the substrate, the stacked body including a plurality of insulating films stacked alternately with a plurality of electrode films;
a conductive member connecting electrically the electrode film to the substrate;
a semiconductor pillar provided in a first portion of the stacked body and extending in a stacking direction of the insulating films and the electrode films;
a charge storage layer provided between the electrode film and the semiconductor pillar; and
a plurality of terraces being formed in a second portion of the stacked body, the plurality of terraces being configured with upper faces of the electrode films respectively, the plurality of terraces being arranged along only a first direction and configuring a stairstep configuration,
the conductive member being lead out from the terrace along a second direction, and
the first direction and the second direction being parallel to the upper face of the substrate and intersecting each other,
wherein the terraces are arranged to form a valley in the stairstep portion, a level number of the electrode film included in the terrace changes n (n being an integer not less than 2) at a time at a slope of the valley, and the level number of the electrode film included in the terrace changes only one at a time at a bottom of the valley.

11. The device according to claim 10, wherein a plurality of the valleys are formed, and the level number of the electrode film included in the terrace changes only one at a time at a peak between the valleys.

* * * * *